(12) United States Patent
Kato

(10) Patent No.: US 11,606,071 B2
(45) Date of Patent: Mar. 14, 2023

(54) SEMICONDUCTOR DEVICE AND POTENTIAL MEASUREMENT APPARATUS

(71) Applicant: SONY SEMICONDUCTOR SOLUTIONS CORPORATION, Kanagawa (JP)

(72) Inventor: Yuri Kato, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/756,544

(22) PCT Filed: Oct. 23, 2018

(86) PCT No.: PCT/JP2018/039366
§ 371 (c)(1),
(2) Date: Apr. 16, 2020

(87) PCT Pub. No.: WO2019/082894
PCT Pub. Date: May 2, 2019

(65) Prior Publication Data
US 2020/0295722 A1 Sep. 17, 2020

(30) Foreign Application Priority Data

Oct. 23, 2017 (JP) .............................. JP2017-204295
Mar. 9, 2018 (JP) .............................. JP2018-043463

(51) Int. Cl.
*H03F 3/68* (2006.01)
*G01R 29/12* (2006.01)
*H03F 3/45* (2006.01)

(52) U.S. Cl.
CPC ............... *H03F 3/68* (2013.01); *G01R 29/12* (2013.01); *H03F 3/45076* (2013.01)

(58) Field of Classification Search
CPC .................. H03F 3/68; H03F 3/45076; H03F 2203/45212; H03F 3/45753;
(Continued)

(56) References Cited

U.S. PATENT DOCUMENTS 5,859,798 A 1/1999 Yero
5,917,547 A 6/1999 Merrill et al.
(Continued)

FOREIGN PATENT DOCUMENTS

EP 3361242 A 8/2018
JP 2002-031617 1/2002
(Continued)

OTHER PUBLICATIONS

Extended European Search Report for European Patent Application No. 18871710.2, dated Nov. 19, 2020, 8 pages.
(Continued)

*Primary Examiner* — Samuel S Outten
*Assistant Examiner* — Khiem D Nguyen
(74) *Attorney, Agent, or Firm* — Sheridan Ross P.C.

(57) ABSTRACT

To provide a semiconductor device that makes it possible to reduce a cell circuit area and an increase in resolution. There is provided a semiconductor device including: a first region in which readout cells are arranged in an array form, the readout cells having one of input transistors included in a differential amplifier: and a second region in which reference cells are arranged in an array form, the reference cells having another input transistor included in the differential amplifier, the first region and the second region being separated from each other.

18 Claims, 27 Drawing Sheets

(58) Field of Classification Search
CPC . H03F 2203/45101; H03F 2203/45536; H03F 2203/45551; H03F 2203/45674; H03F 2203/45544; H03F 3/45183; H03F 3/45475; G01R 29/12; G01N 27/4148
USPC .................................................. 330/252–261
See application file for complete search history.

(56) References Cited

U.S. PATENT DOCUMENTS

| | | | |
|---|---|---|---|
| 8,537,241 B2 * | 9/2013 | Ayers | ................. H04N 5/37455 |
| | | | 348/308 |
| 2002/0113607 A1 | 8/2002 | Yukimasa | |
| 2011/0254988 A1 | 10/2011 | Itakura et al. | |
| 2015/0091581 A1 | 4/2015 | Sohbati et al. | |
| 2017/0054926 A1 | 2/2017 | Kikuchi | |

FOREIGN PATENT DOCUMENTS

| | | |
|---|---|---|
| JP | 2002507864 A | 3/2002 |
| JP | 2015-512636 | 4/2015 |
| WO | WO 99/48282 | 9/1999 |
| WO | WO 2017/061171 | 4/2017 |

OTHER PUBLICATIONS

International Search Report and Written Opinion prepared by the Japanese Patent Office dated Nov. 15, 2018, for International Application No. PCT/JP2018/039366.

* cited by examiner

FIG. 23
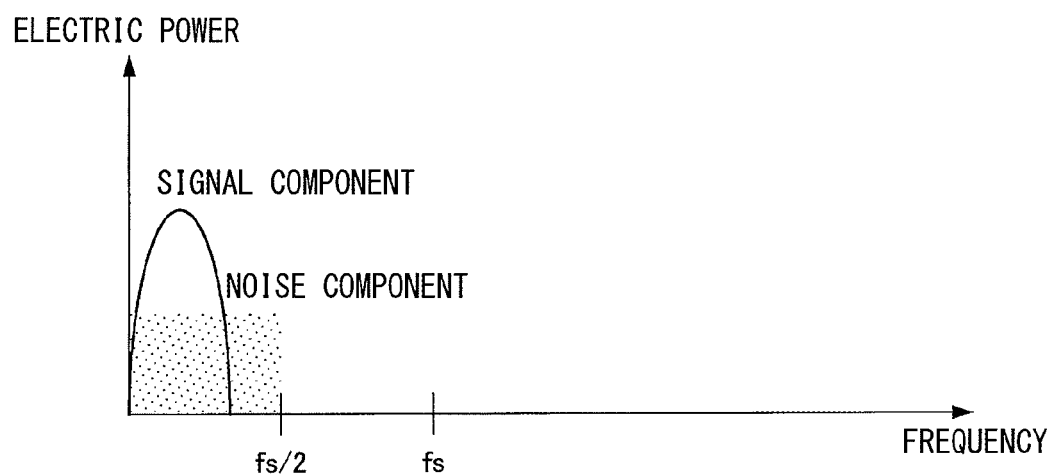
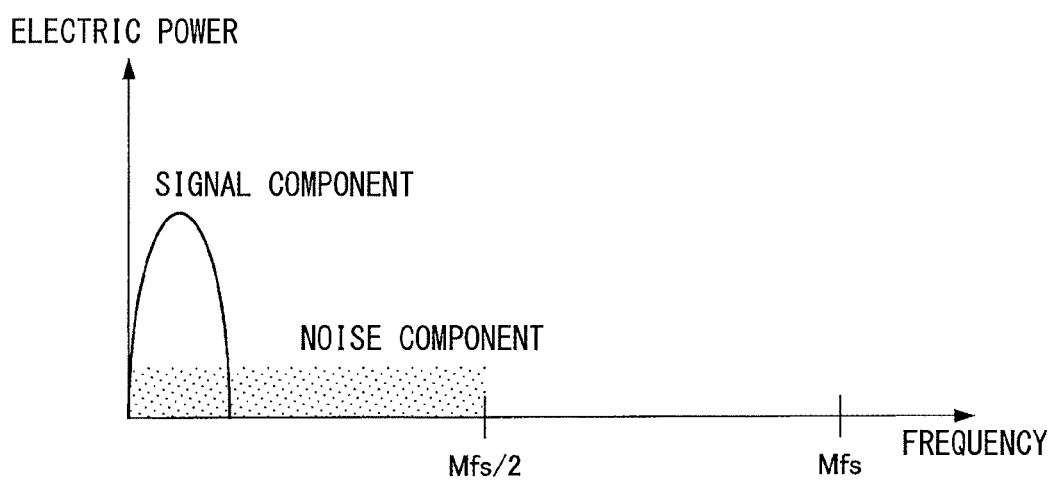

ize:-1.25em,0em;">

SEMICONDUCTOR DEVICE AND POTENTIAL MEASUREMENT APPARATUS

CROSS REFERENCE TO RELATED APPLICATIONS

This application is a national stage application under 35 U.S.C. 371 and claims the benefit of PCT Application No. PCT/JP2018/039366 having an international filing date of 23 Oct. 2018, which designated the United States, which PCT application claimed the benefit of Japanese Patent Application Nos. 2017-204295 filed 23 Oct. 2017 and 2018-043463 filed 9 Mar. 2018, the entire disclosures of each of which are incorporated herein by reference.

TECHNICAL FIELD

The present disclosure relates to a semiconductor device and a potential measurement apparatus.

BACKGROUND ART

In recent years, a device in which electrodes, an amplifier, an AD converter, and the like are integrated on one chip with use of a CMOS (Complementary MOS) integrated circuit technology and potentials at multiple points are measured simultaneously has attracted attention (refer to Non-Patent Literatures 1, 2, and the like). In such a device, there has been reported a device in which a potential difference between a "reference electrode" placed in a solution far from a potential generation point and a "readout electrode" located in proximity to the potential generation point is multiplied by a differential type amplifier and outputted (refer to Non-Patent Literature 3).

CITATION LIST

Non-Patent Literature

NPTL 1: IEEE Journal of Solid State Circuits Vol. 45 (2010) No. 2 pp. 467-482
NPTL 2: Lab on a Chip Vol. 9 (2009) pp. 2647-2651
NPTL 3: Proceedings of the IEEE Vol. 99, No. 2, February 2011, pp. 252-284

SUMMARY OF THE INVENTION

Problems to be Solved by the Invention

However, for the device in which the potential difference between the "reference electrode" and the "readout electrode" located in proximity to the potential generation point is multiplied by the differential type amplifier and outputted, it is necessary to provide two input transistors (amplifier transistors) included in a differential amplifier circuit in one cell circuit. This is a bottleneck in a reduction in cell circuit area, i.e., an increase in resolution. It is therefore difficult to achieve an increase in resolution while maintaining low noise in a case where a differential amplifier is adopted.

Accordingly, the present disclosure proposes novel and improved semiconductor device and potential measurement apparatus that make it possible to reduce a cell circuit area and achieve an increase in resolution.

Means for Solving the Problems

According to the present disclosure, there is provided a semiconductor device including: a first region in which readout cells are arranged in an array form, the readout cells having one of input transistors included in a differential amplifier: and a second region in which reference cells are arranged in an array form, the reference cells having another input transistor included in the differential amplifier, the first region and the second region being separated from each other.

In addition, according to the present disclosure, there is provided a potential measurement apparatus including: the semiconductor device described above; a horizontal selection circuit that selects a cell of the first region and a cell of the second region of the semiconductor device; and an A/D conversion circuit that converts an analog signal outputted from the semiconductor device into a digital signal.

Effects of the Invention

As described above, according to the present disclosure, it is possible to provide novel and improved semiconductor device and potential measurement apparatus that make it possible to reduce a cell circuit area and achieve an increase in resolution.

It should be noted that the effects described above are not necessarily limitative. Any of the effects indicated in this description or other effects that may be understood from this description may be exerted in addition to the effects described above or in place of the effects described above.

BRIEF DESCRIPTION OF DRAWINGS

FIG. 23 is an explanatory diagram illustrating an example of oversampling.

MODES FOR CARRYING OUT THE INVENTION

Figure 1:
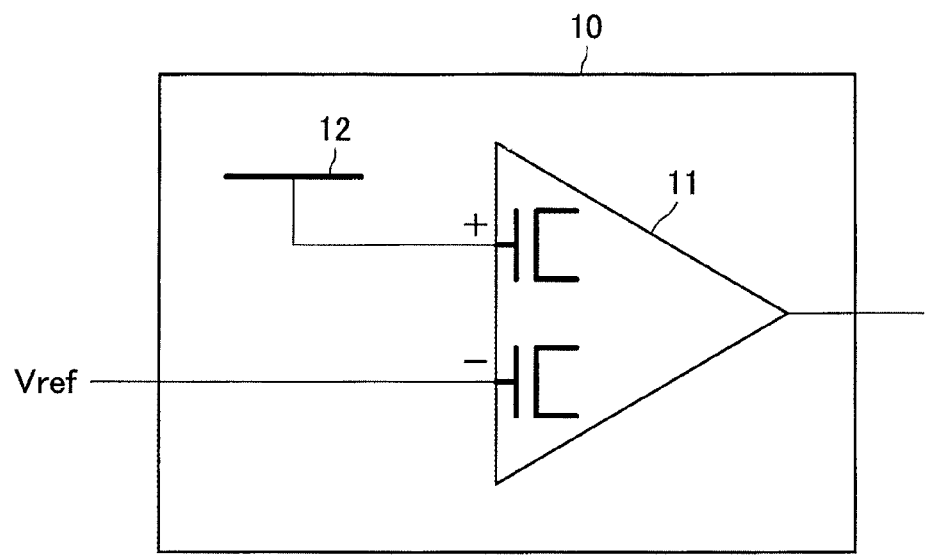
FIG. 1 is an explanatory diagram illustrating an example in which one cell circuit includes a differential amplifier circuit having two input transistors.

A preferred embodiment of the present disclosure is described below in detail with reference to the accompanying drawings. It should be noted that, in this description and the accompanying drawings, components that have substantially the same functional configuration are denoted by the same reference numerals, and thus redundant description thereof is omitted.

It should be noted that the description is given in the following order.

1. Embodiment of the Present Disclosure
1.1. Overview
1.2. Configuration Examples
2. Conclusion 1. Embodiment of Present Disclosure

[1.1. Overview]

First, an overview of an embodiment of the present disclosure will be described before describing details on the embodiment of the present disclosure.

As described above, in recent years, a device in which electrodes, an amplifier, an AD converter, and the like are integrated on one chip with use of a CMOS (Complementary MOS) integrated circuit technology and potentials at multiple points are measured simultaneously has attracted attention (refer to Non-Patent Literatures 1, 2, and the like). Such a device is used, for example, for an application in electrochemical measurement of a potential of a solution. Japanese Unexamined Patent Application Publication No. 2002-31617 discloses a technology of a device that places biological cells on microelectrodes filled with a culture medium to measure an action potential generated by the biological cells in devices that electrochemically measures a potential of a solution on microelectrodes arranged in an array form.

There are roughly two types of devices using an existing CMOS integrated circuit technology, which are a device that dynamically changes coupling a wire of each readout electrode, and couples the wire of each readout electrode to an amplifier independent of electrodes and measures a potential (NPTL 1) and a device that has one amplifier for each electrode (NPTL 2).

In such a device, there has been reported a device in which a potential difference between a "reference electrode" placed in a solution far from a potential generation point and a "readout electrode" located in proximity to the potential generation point is multiplied by a differential type amplifier and outputted (refer to NPTL 3). In such a device, circuit noise of the differential amplifier and subsequent circuits is suppressed to reciprocal times of an amplification gain of an amplifier; therefore, a reduction in noise of the device is expectable.

However, for the device in which the potential difference between the "reference electrode" and the "readout electrode" in proximity to the potential generation point is multiplied by the differential type amplifier and outputted, it is necessary to provide two input transistors (amplifier transistors) included in a differential amplifier circuit in one cell circuit. FIG. 1 is an explanatory diagram illustrating an example in which one cell circuit 10 includes a differential amplifier circuit 11 having two input transistors. The differential amplifier circuit 11 compares a potential of a readout electrode 12 with a reference potential (Vref) from a reference electrode (not illustrated) and outputs a result of such comparison.

Figure 2:
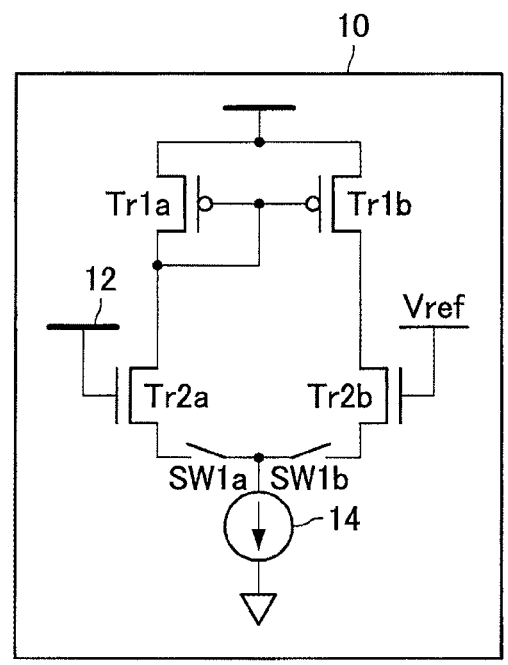
FIG. 2 is an explanatory diagram illustrating a configuration of the differential amplifier circuit illustrated in FIG. 1 in more detail.

FIG. 2 is an explanatory diagram illustrating a configuration of the differential amplifier circuit 11 in more detail. In the differential amplifier circuit 11, MOSFETs Tr1$a$ and Tr1$b$ included in a current mirror circuit, an input transistor Tr2$a$ having a gate to which a potential from the readout electrode 12 is inputted, an input transistor Tr2$b$ having a gate to which the reference potential (Vref) from the reference electrode is inputted, and a current source 14 are illustrated. Here, the MOSFETs Tr1$a$ and Tr1$b$ are PMOS transistors, and MOSFETs Tr2$a$ and Tr2$b$ are NMOS transistors.

Having two input transistors (amplifier transistors) in one cell circuit in such a manner is a bottleneck in a reduction in cell circuit area, i.e., an increase in resolution. In particular, it is necessary to include relatively large-sized transistors for a reduction in noise as the input transistors (amplifier transistors), which occupy a large area of the cell circuit. It is therefore difficult to achieve an increase in resolution while maintaining low noise in a case where a differential amplifier is adopted.

Therefore, in view of the points described above, the discloser of the present application has intensively studied a technology for reducing a cell circuit area and achieving an increase in resolution in a device that is able to simultaneously detect potentials at multiple points. As a result, the discloser of the present application has devised a technology that reduces the cell circuit area and achieves an increase in resolution in the device that is able to simultaneously detect the potentials at the multiple points, as described below.

The overview of the embodiment of the present disclosure has been described above. Next, the embodiment of the present disclosure will be described in detail.

[1.2. Configuration Example]

The present embodiment is characterized in that transistors included in a differential amplifier are disposed separately in two cell circuits instead of providing a differential amplifier including two input transistors in one cell circuit as described above. One of the cell circuits is a readout cell having a readout electrode, and the other cell circuit is a reference cell receiving an input of a reference potential. It should be noted that in the reference cell, a reference electrode may be provided inside the cell, or the reference electrode may be provided outside the cell. Thus, disposing the differential amplifier separately in two cell circuits makes it possible to reduce a cell circuit area and achieve an increase in resolution.

Figure 3:
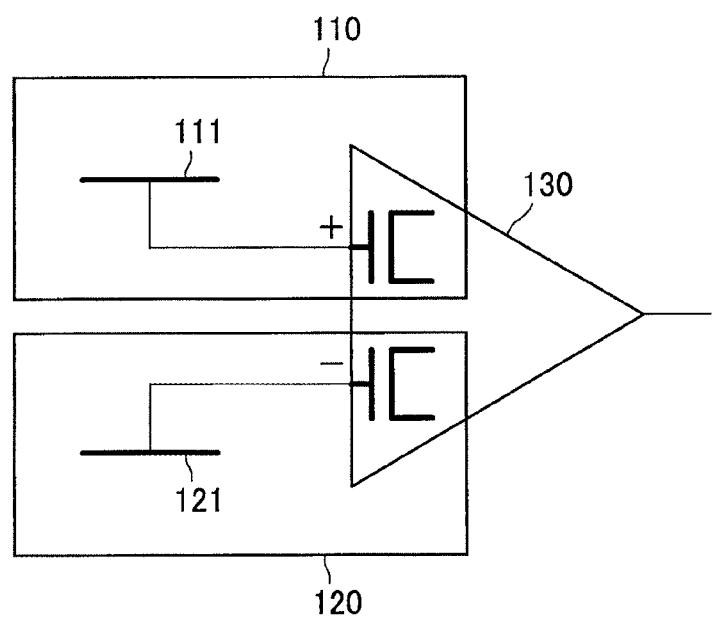
FIG. 3 is an explanatory diagram illustrating a configuration example of a differential amplifier according to an embodiment of the present disclosure.

FIG. 3 is an explanatory diagram illustrating a configuration example of a differential amplifier according to the embodiment of the present disclosure. In the present embodiment, as illustrated in FIG. 3, a differential amplifier circuit 130 in which a transistor is disposed in each of a readout cell 110 and a reference cell 120 measures a potential difference between a reference electrode and a readout electrode. The readout cell 110 is provided with a readout electrode 111, and the reference cell 120 is provided with a reference electrode 121. It should be noted that in the present disclosure, amplifier transistors included in the differential amplifier circuit 130 may be provided below the read electrode 12 and the reference electrode respectively provided in the corresponding readout cell 110 and the corresponding reference cell 120, or may be provided below an electrode of an adjacent cell or any other cell. It should be noted that the above-described "below" indicates a depth direction of a substrate with reference to a surface of the read electrodes 12 or the reference electrode. It should be noted that, as described above, the reference electrode 121 may not be provided inside the reference cell 120.

Figure 4:
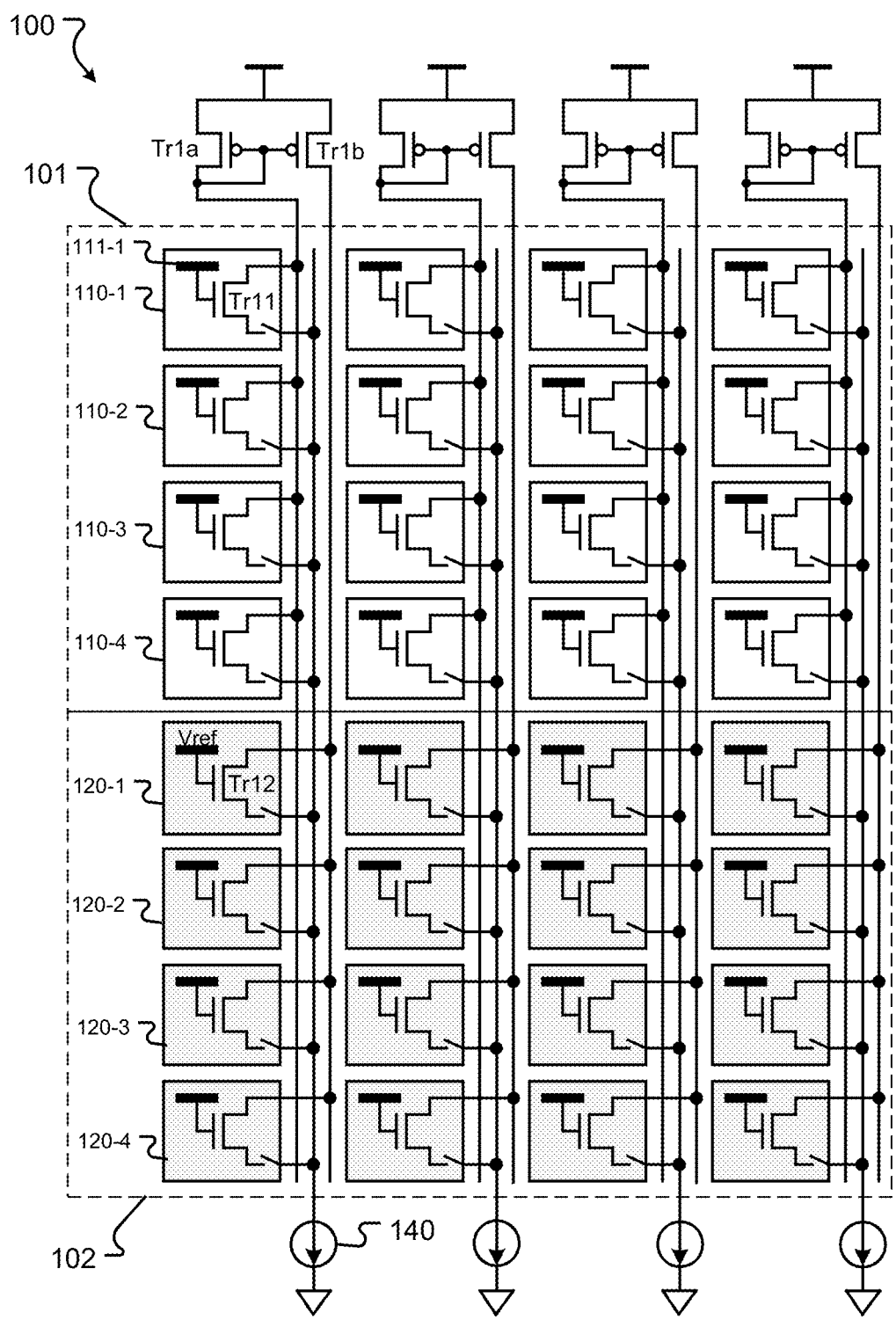
FIG. 4 is an explanatory diagram illustrating a configuration example of a semiconductor device according to the same embodiment.

Further, the present embodiment is characterized in that, in addition to disposing the transistors included in the differential amplifier separately in two cell circuits as described above, a region in which the readout cell 110 is disposed and a region in which the reference cell 120 is disposed are separate regions. FIG. 4 is an explanatory diagram illustrating a configuration example of a semiconductor device 100 according to the embodiment of the present disclosure. The semiconductor device 100 illustrated in FIG. 4 is a device that is able to simultaneously detect potentials at multiple points, and includes a readout cell region 101 in which a plurality of readout cells 110 is arranged in a matrix form, and a reference cell region 102 in which a plurality of reference cells 120 is arranged in a matrix form. The readout cell region 101 is a region in which circuit elements included in one input transistor of a differential amplifier are disposed. The readout cell region 101 is, for example, a region directly above which biological cells are cultured to obtain action potentials in the biological cells. The reference cell region 102 is a region in which circuit elements included in the other input transistor of the differential amplifier are disposed.

Referring to a leftmost column in the semiconductor device 100 illustrated in FIG. 4, four readout cells 110-1 to 110-4 are disposed in the readout cell region 101, and four reference cells 120-1 to 120-4 are disposed in the reference cell region 102.

The semiconductor device 100 according to the embodiment of the present disclosure has a configuration in which the readout cell region 101 and the reference cell region 102 are disposed in this manner; therefore, it is sufficient if a unit cell of readout cells arranged in the readout cell region 101 in which action potentials are measured has one of the input transistors included in the differential amplifier. This makes it possible to achieve an increase in resolution by a reduction in a cell size while maintaining low noise by the differential amplifier.

In the semiconductor device 100 illustrated in FIG. 4, the number of readout cells and the number of reference cells are the same as each other. Such a configuration increases the area of the reference cell region 102, resulting in an increase in a circuit area. Accordingly, reducing the number of reference cells makes it possible to reduce the area of the reference cell region 102 and suppress an increase in the circuit area.

Figure 5:
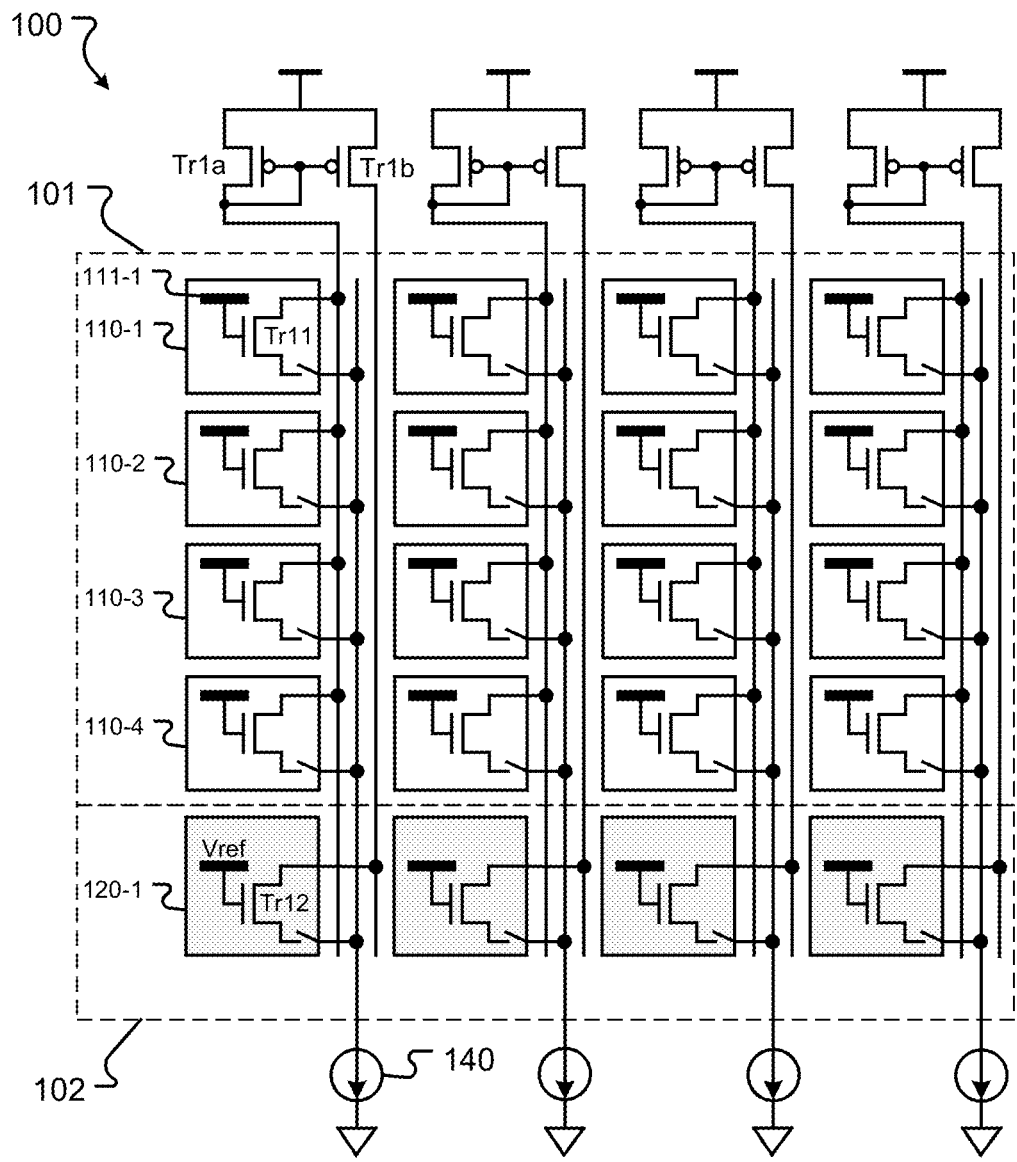
FIG. 5 is an explanatory diagram illustrating a configuration example of the semiconductor device according to the same embodiment.

FIG. 5 is an explanatory diagram illustrating a configuration example of semiconductor device 100 according to the embodiment of the present disclosure. The semiconductor device 100 illustrated in FIG. 5 has a reduced number of reference cells 120 disposed in the reference cell region 102, as compared with the semiconductor device 100 illustrated in FIG. 4. That is, the semiconductor device 100 illustrated in FIG. 5 is characterized in that one reference cell is shared by a plurality of readout cells.

Referring to a leftmost column in the semiconductor device 100 illustrated in FIG. 5, four readout cells 110-1 to 110-4 are disposed in the readout cell region 101, and one reference cell 120-1 is disposed in the reference cell region 102. That is, a transistor of the reference cell 120-1 is shared by transistors of a plurality of readout cells 110-1 to 110-4.

Sharing one reference cell by a plurality of readout cells in such a manner makes it possible for the semiconductor device 100 illustrated in FIG. 5 to reduce the circuit area as compared with the semiconductor device 100 illustrated in FIG. 4.

Figure 6:
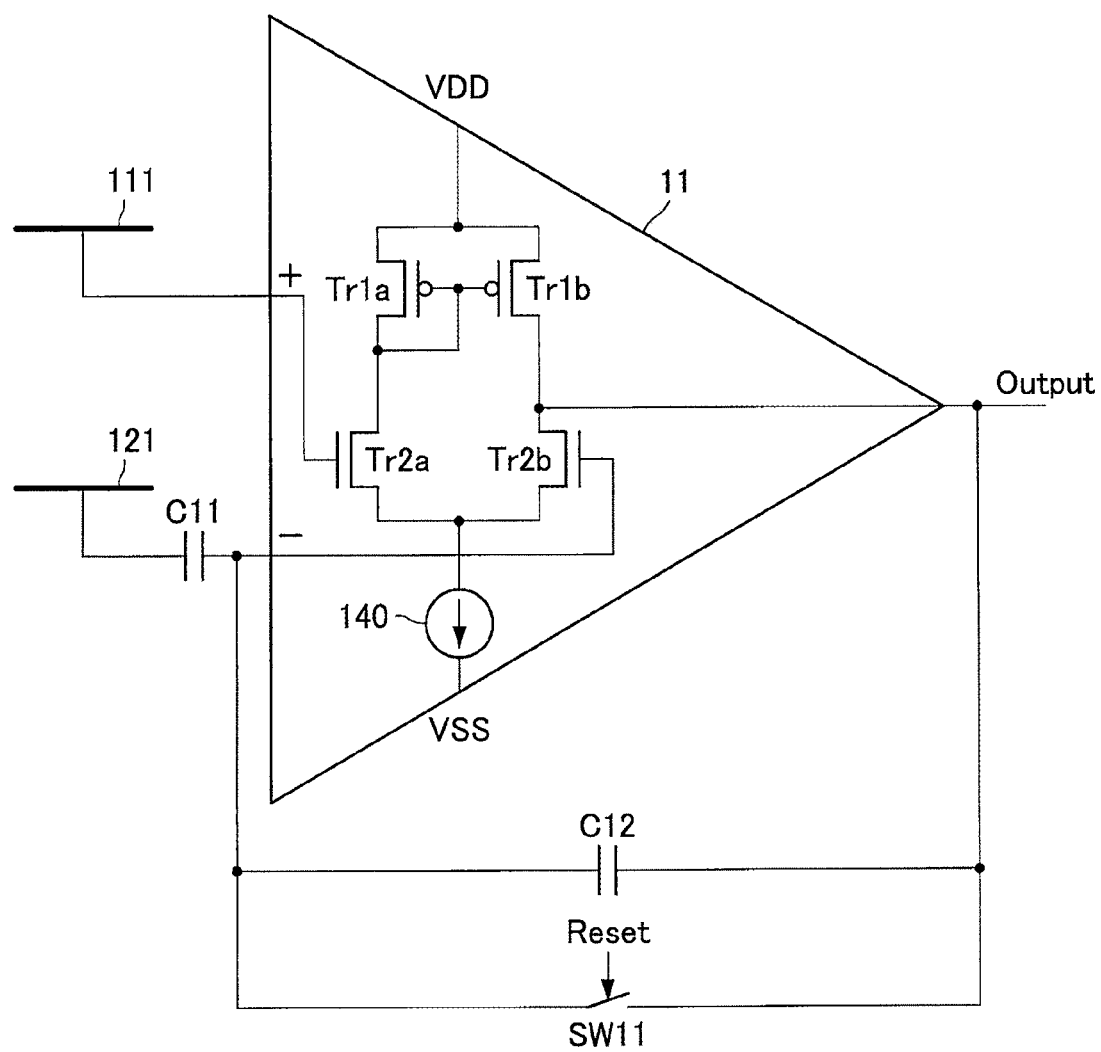
FIG. 6 is an explanatory diagram illustrating a configuration example of a differential amplifier circuit in the semiconductor device according to the same embodiment.

FIG. 6 is an explanatory diagram illustrating a configuration example of a differential amplifier circuit in the semiconductor device 100 according to the embodiment of the present disclosure. FIG. 6 illustrates a differential amplifier having a PMOS current mirror as a load resistor characterized in that an input transistor on a diode-coupled side of a PMOS transistor, that is, on a side on which an amplification gain is not applied is coupled to a readout electrode to form, on a side on which an amplification gain is applied, a closed loop in which an output of the differential amplifier is fed back to an input.

In the differential amplifier circuit 130 illustrated in FIG. 6, the MOSFETs Tr1a and Tr1b included in a current mirror, the input transistor Tr2a having the gate to which a potential from the readout electrode 111 is inputted, the input transistor Tr2b having the gate to which the reference potential (Vref) from the reference electrode 121 is inputted, and a current source 140 are illustrated. In addition, an output of differential amplifier circuit 130 is fed back to the input transistor Tr2*b* to which an output from the reference electrode 121 is inputted. Capacitors C11 and C12 are provided for capacitively coupling of the reference electrode 121, and a differential amplifier is allowed to cancel a common-mode noise component mixed in the readout electrode and the reference electrode by the capacitors C11 and C12. A switch SW11 is a switch for short-circuiting an output of the differential amplifier circuit 130 and an input of the input transistor Tr2*b* on the reference electrode 121 side. As the switch SW11, for example, a switching element such as a MOSFET is used. The switch SW 11 is also allowed to cancel a mismatch between a voltage threshold of the input transistor Tr2*b* of the reference electrode and a voltage threshold of the input transistor Tr2*a* of the readout electrode.

Figure 7:
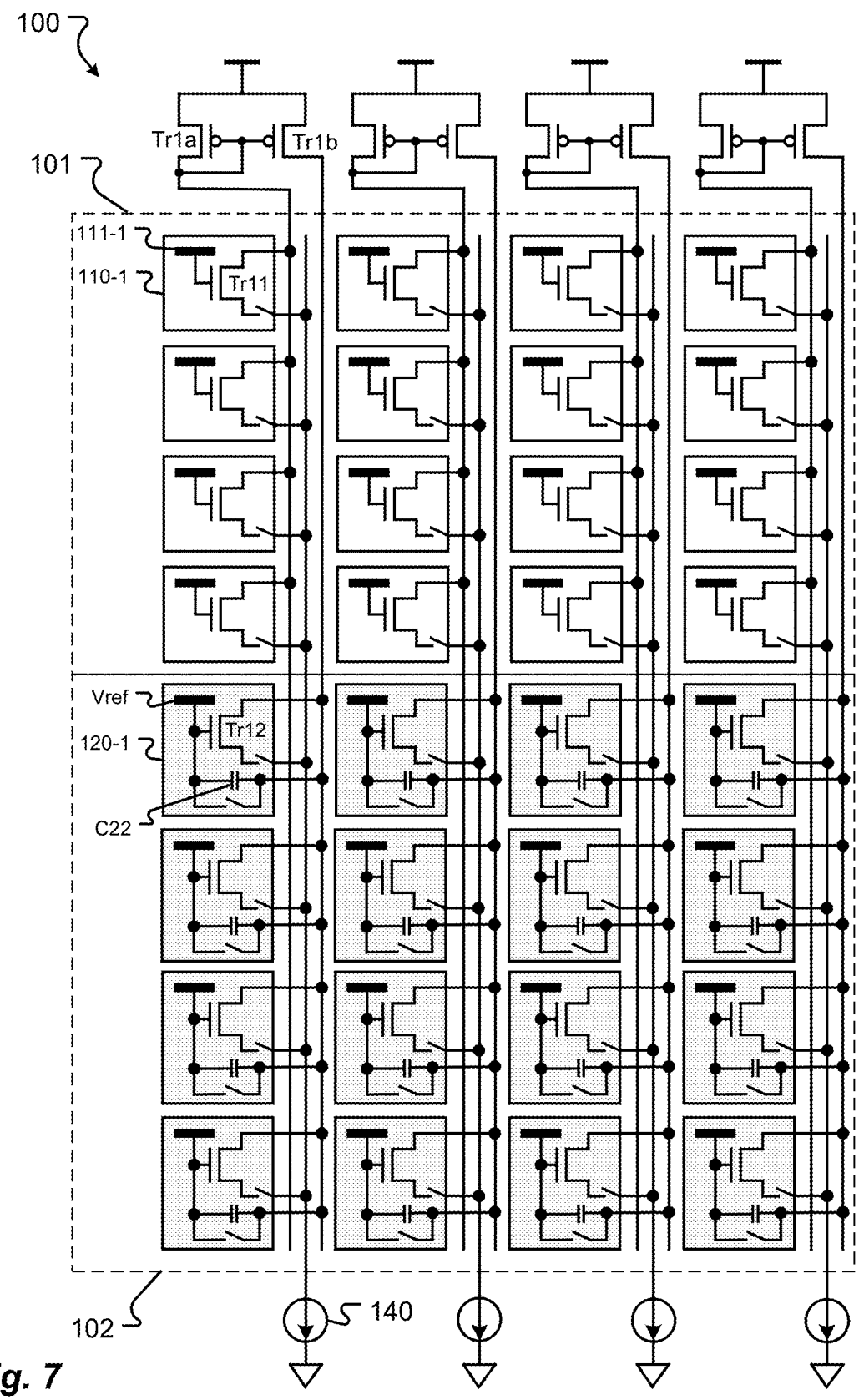
FIG. 7 is an explanatory diagram illustrating a configuration example of the semiconductor device according to the same embodiment.

FIG. 7 is an explanatory diagram illustrating a configuration example of the semiconductor device 100 according to the embodiment of the present disclosure, in which in addition to disposing respective input transistors of the differential amplifier circuit 130 illustrated in FIG. 6 separately in two cell circuits, a region in which the readout cell 110 is disposed and a region in which the reference cell 120 is disposed are separate regions.

Referring to a leftmost column of the semiconductor device 100 illustrated in FIG. 7, four readout cells 110-1 to 110-4 are disposed in the readout cell region 101, and four reference cells 120-1 to 120-4 are disposed in the reference cell region 102. Needless to say, as illustrated in FIG. 5, a configuration in which one reference cell is shared by a plurality of readout cells may be adopted.

Figure 8:
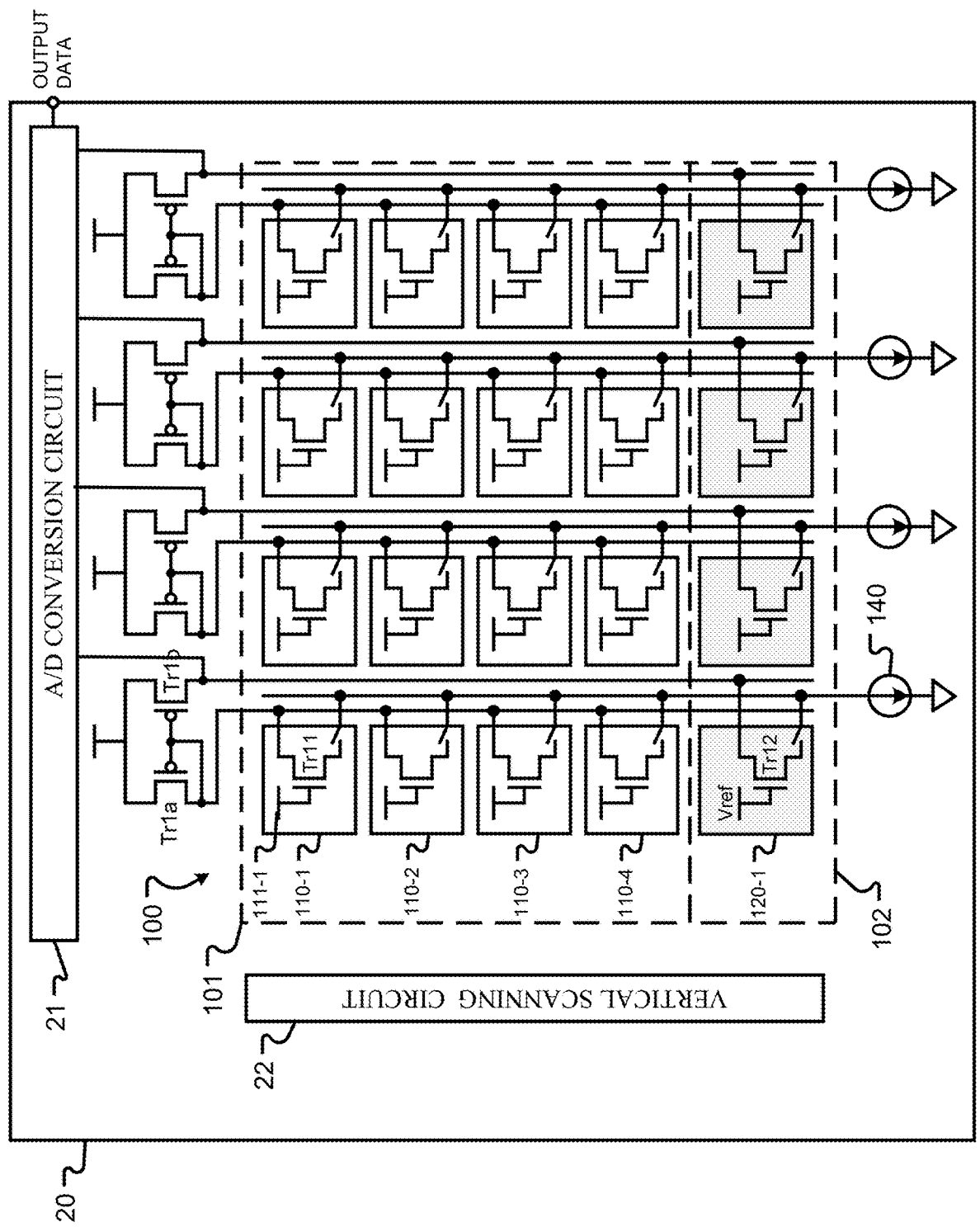
FIG. 8 is an explanatory diagram illustrating a configuration example of a potential measurement apparatus according to the same embodiment.

FIG. 8 is an explanatory diagram illustrating a configuration example of a potential measurement apparatus 20 according to the embodiment of the present disclosure. FIG. 8 illustrates a device that is able to simultaneously detect potentials at multiple points. The potential measurement apparatus 20 illustrated in FIG. 8 includes an A/D conversion circuit 21, a vertical scanning circuit 22, and the semiconductor device 100. Then, the semiconductor device 100 includes the readout cell region 101 and the reference cell region 102.

The A/D conversion circuit 21 is a circuit that converts analog data measured by the semiconductor device 100 into digital data. A configuration of the A/D conversion circuit 21 is not limited to any specific configuration. The vertical scanning circuit 22 outputs, to the semiconductor device 100, a signal for selecting a readout cell and a reference cell used for measurement of a potential. In the configuration illustrated in FIG. 8, the A/D conversion circuit 21 and the reference cell region 102 are formed at positions opposed to each other with the readout cell region 101 interposed therebetween. In other words, the reference cell region 102 is provided on a side opposed to a region in which A/D conversion circuit 21 is provided with the readout cell region 101 interposed therebetween.

The potential measurement apparatus 20 having the configuration as illustrated in FIG. 8 makes it possible to achieve an increase in resolution while maintaining low noise by the differential amplifier. Further, as illustrated in FIG. 8, the readout cell region 101 in the semiconductor device 100 is disposed in a central region of the potential measurement apparatus 20, which makes it possible for the potential measurement apparatus 20 to secure a wide measurement region during measurement of the potential.

Although an example of the semiconductor device in which the readout cell region is disposed between the current mirror circuit and the reference cell region as described above has been described, the present disclosure is not limited to this example. For example, a configuration may be adopted in which the reference cell region is disposed perpendicular to a side on which the current mirror circuit is disposed, and the readout cell region is disposed between the reference cell regions.

Figure 9:
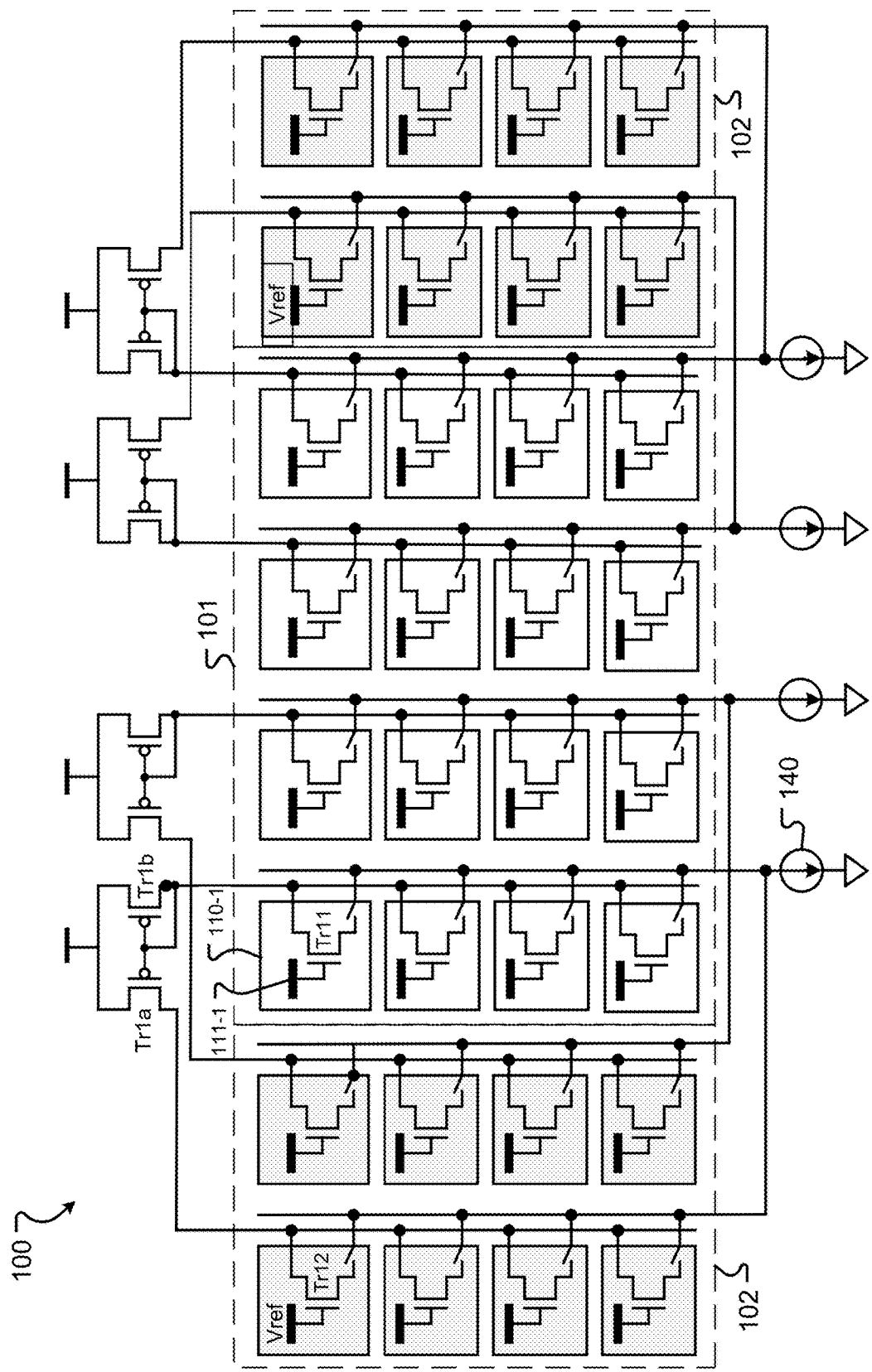
FIG. 9 is an explanatory diagram illustrating a configuration example of the semiconductor device according to the same embodiment.

FIG. 9 is an explanatory diagram illustrating a circuit configuration example of the semiconductor device 100 according to the embodiment of the present disclosure. In the semiconductor device 100 illustrated in FIG. 9, the reference cell region 102 is disposed perpendicular to a side on which a PMOS current mirror circuit is disposed, and the readout cell region 101 is interposed between two reference cell regions 102. In other words, in the semiconductor device 100 illustrated in FIG. 9, the readout cell region 101 and the reference cell regions 102 are disposed to cause distances from each of the readout cell and the reference cell to the PMOS current mirror circuit and the current source to be substantially equal.

Such disposition makes it possible for the semiconductor device 100 illustrated in FIG. 9 to reduce a difference between voltage drop amounts by wiring. That is, the semiconductor device 100 illustrated in FIG. 9 makes it possible to improve symmetry of a differential pair of the differential amplifier circuit. As a result, the semiconductor device 100 illustrated in FIG. 9 makes it possible to prevent a decrease in a circuit operation range by voltage drops.

Figure 10:
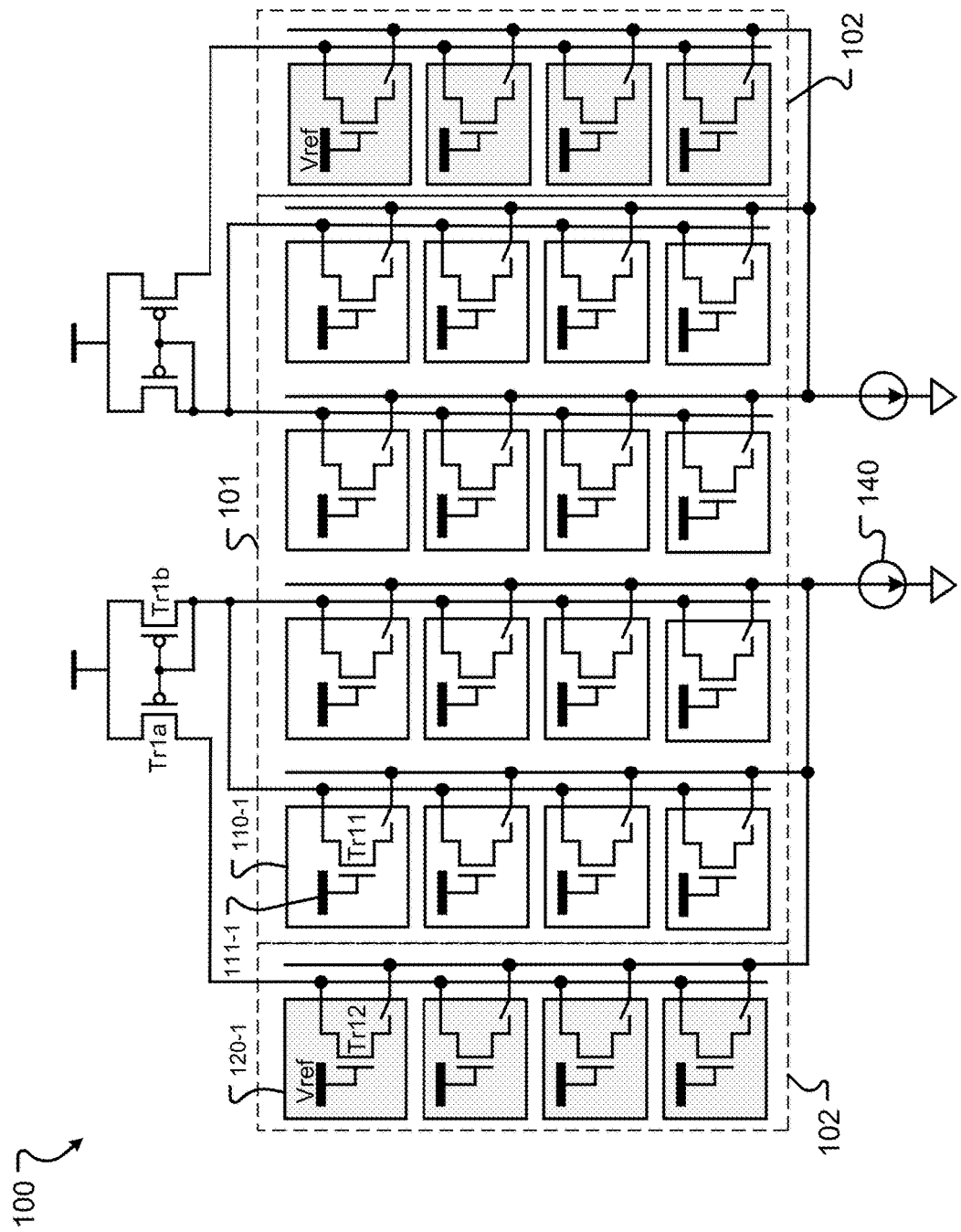
FIG. 10 is an explanatory diagram illustrating a configuration example of the semiconductor device according to the same embodiment.

FIG. 9 illustrates the semiconductor device 100 in which the number of readout cells and the number of reference cells are 1:1, but the reference cell may be shared by a plurality of readout cells, as described above. FIG. 10 is an explanatory diagram illustrating a configuration example of the semiconductor device 100 according to the embodiment of the present disclosure. FIG. 10 illustrates an example of the semiconductor device 100 in which the number of reference cells is reduced from the example illustrated in FIG. 9 by sharing a reference cell by a plurality of readout cells. Sharing the reference cell by a plurality of readout cells makes it possible for the semiconductor device 100 illustrated in FIG. 10 to further reduce the circuit area as compared with the configuration illustrated in FIG. 9, while obtaining effects such as a reduction in the difference between the voltage drop amounts by wiring, an improvement in the symmetry of the differential pair, and prevention of a decrease in the circuit operation range by the voltage drops, as described above.

Figure 11:
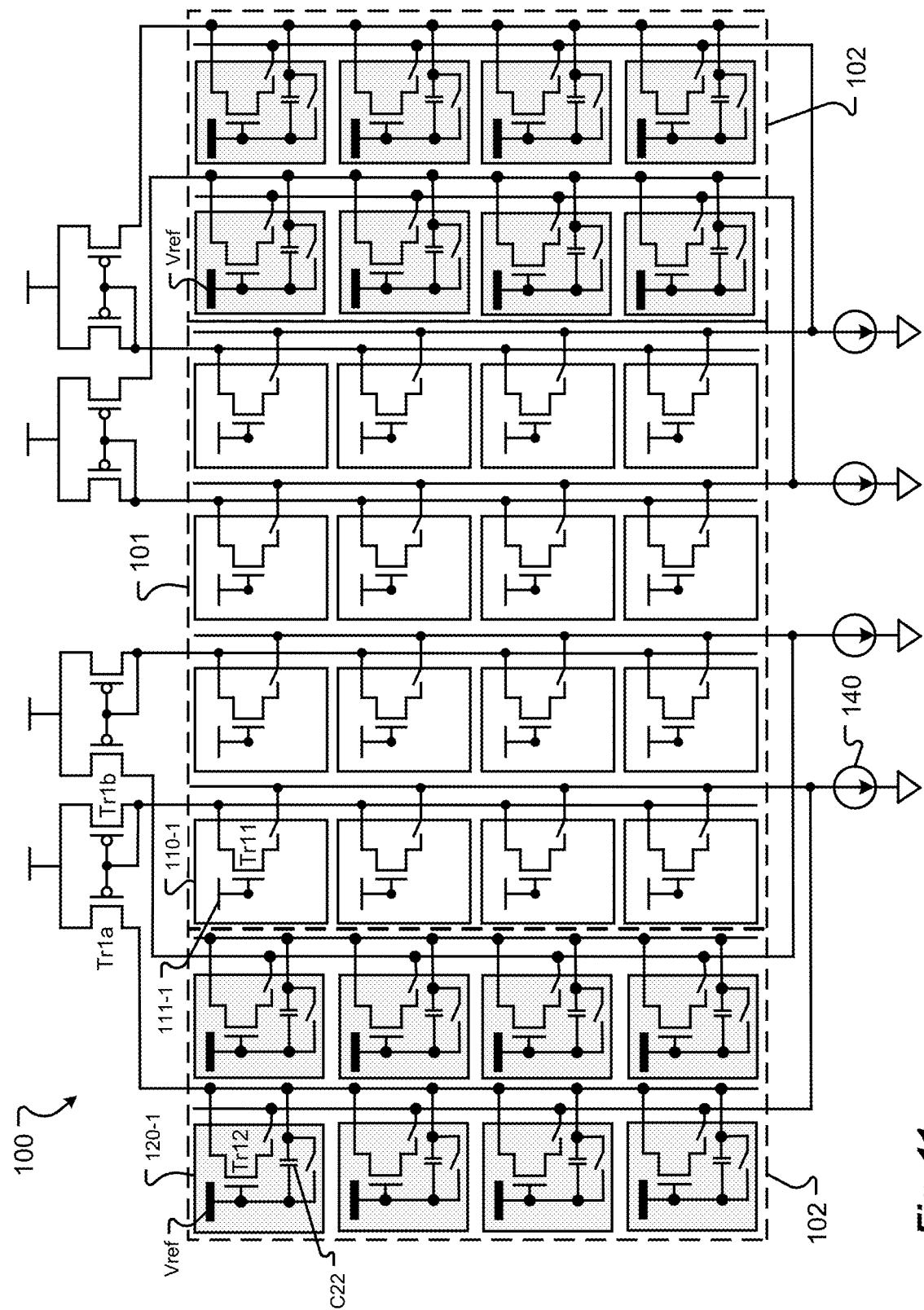
FIG. 11 is an explanatory diagram illustrating a configuration example of the semiconductor device according to the same embodiment.

Further, as illustrated in FIG. 6 and FIG. 7, in the differential amplifier having the PMOS current mirror as a load resistor, a diode-coupled side of the PMOS transistor may be coupled to the readout electrode to form, on a side on which an amplification gain is applied, a closed loop in which an output of the differential amplifier is fed back to an input. FIG. 11 is an explanatory diagram illustrating a configuration example of the semiconductor device 100 according to the embodiment of the present disclosure. FIG. 11 illustrates an explanatory diagram illustrating an example in which, in the semiconductor device 100 illustrated in FIG. 9, in the differential amplifier having the PMOS current mirror as the load resistor, as illustrated in FIG. 6 and FIG. 7, a closed loop in which the diode-coupled side of the PMOS transistor is coupled to the readout electrode and the output of the differential amplifier is fed back to the input is formed on the side on which the amplification gain is applied. Such a configuration makes it possible for the semiconductor device 100 illustrated in FIG. 11 to obtain not only the effects of the semiconductor device 100 illustrated in FIG. 9 but also the effects of the configuration illustrated in FIG. 6 and FIG. 7.

In the example illustrated in FIG. 11, the number of readout cells and the number of reference cells are 1:1, but the present disclosure is not limited to this example, and, needless to say, the reference cell may be shared by a plurality of readout cells as illustrated in FIG. 10.

The semiconductor device 100 according to the embodiment of the present disclosure may have a configuration in which differential amplifiers in a plurality of rows are simultaneously turned to an operation state by disposing a plurality of vertical signal lines.

Figure 12:
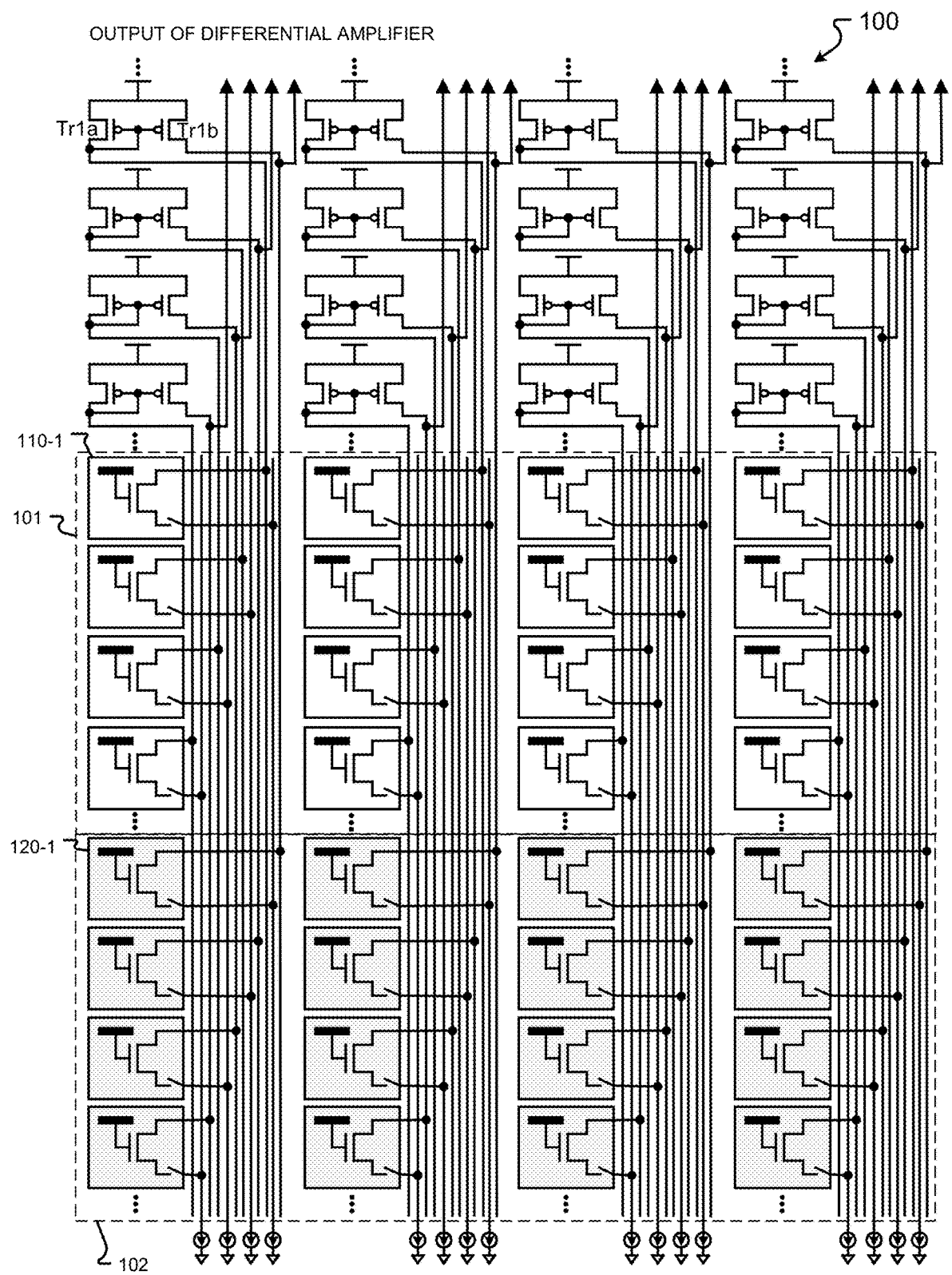
FIG. 12 is an explanatory diagram illustrating a circuit configuration example of the semiconductor device according to the same embodiment.

FIG. 12 is an explanatory diagram illustrating a circuit configuration example of the semiconductor device 100 according to the embodiment of the present disclosure. FIG. 12 illustrates a circuit configuration example of the semiconductor device 100 in which respective cells of the readout cell region 101 and the reference cell region 102 are coupled to different vertical signal lines in a state in which a cell region is separated into the readout cell region 101 and the reference cell region 102. In the example in FIG. 12, four sets of vertical signal lines are disposed, which makes it possible to simultaneously perform outputting from respective cells of the readout cell region 101 and the reference cell region 102 to the differential amplifiers. Needless to say, the number of sets of vertical signal lines is not limited to four.

Increasing the number of sets of vertical signal lines makes it possible for the semiconductor device 100 according to the embodiment of the present disclosure to simultaneously turn the differential amplifiers in a plurality of rows to the operation state. In the semiconductor device 100 according to the embodiment of the present disclosure, simultaneously turning the differential amplifiers in a plurality of rows to the operation state makes it possible to read data at high speed. Further, providing such a semiconductor device 100 in the potential measurement apparatus contributes to an increase in speed of potential measurement by the potential measurement apparatus.

The semiconductor device 100 according to the present embodiment may have a configuration in which outputs are distributed to a plurality of A/D conversion circuits.

Figure 13:
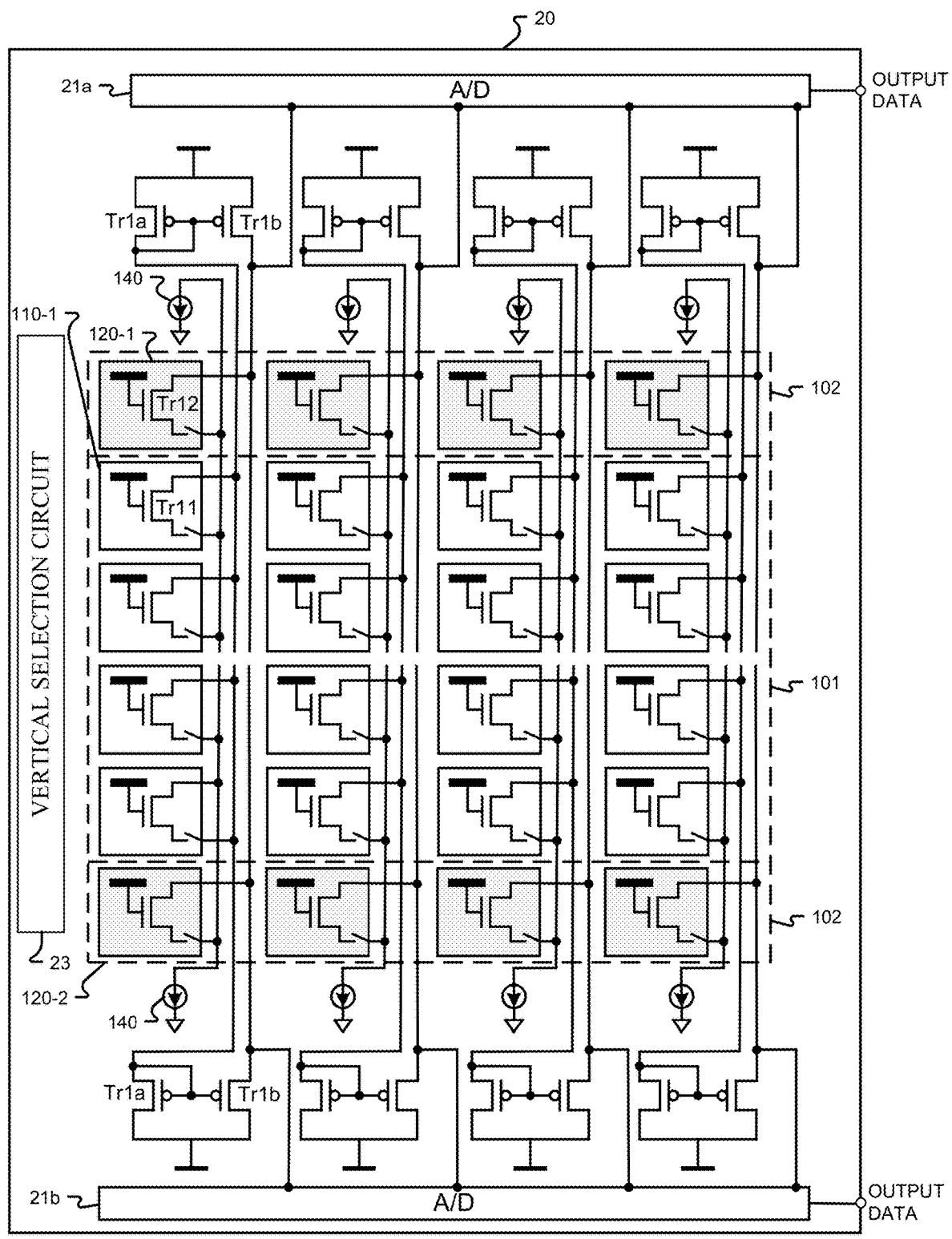
FIG. 13 is an explanatory diagram illustrating a configuration example of the potential measurement apparatus according to the same embodiment.

FIG. 13 is an explanatory diagram illustrating a configuration example of the potential measurement apparatus 20 according to the embodiment of the present disclosure. FIG. 13 illustrates a configuration example of the potential measurement apparatus 20 having two A/D conversion circuits 21a and 21b at positions opposed to each other (above and below a cell array region in the drawing) in the potential measurement apparatus 20. In addition, FIG. 13 illustrates a vertical selection circuit 23. The vertical selection circuit 23 is a circuit that outputs a signal for selection of a cell to each of the readout cell region 101 and the reference cell region 102.

In the example illustrated in FIG. 13, the cell region is separated into the readout cell region 101 and the reference cell region 102 in a manner similar to that in in the example described above, but in order to distribute outputs to the two A/D conversion circuits 21a and 21b, the signal lines are separated in a middle portion. The potential measurement apparatus 20 according to the embodiment of the present disclosure has such a configuration, which makes it possible to input output signals of the differential amplifiers to the respective upper and lower A/D conversion circuits 21a and 21b in the drawing. This makes it possible for the potential measurement apparatus 20 according to the embodiment of the present disclosure to output data from the A/D conversion circuits 21a and 21b, thereby making it possible to output a result of potential measurement to outside of the apparatus at high speed.

Figure 14:
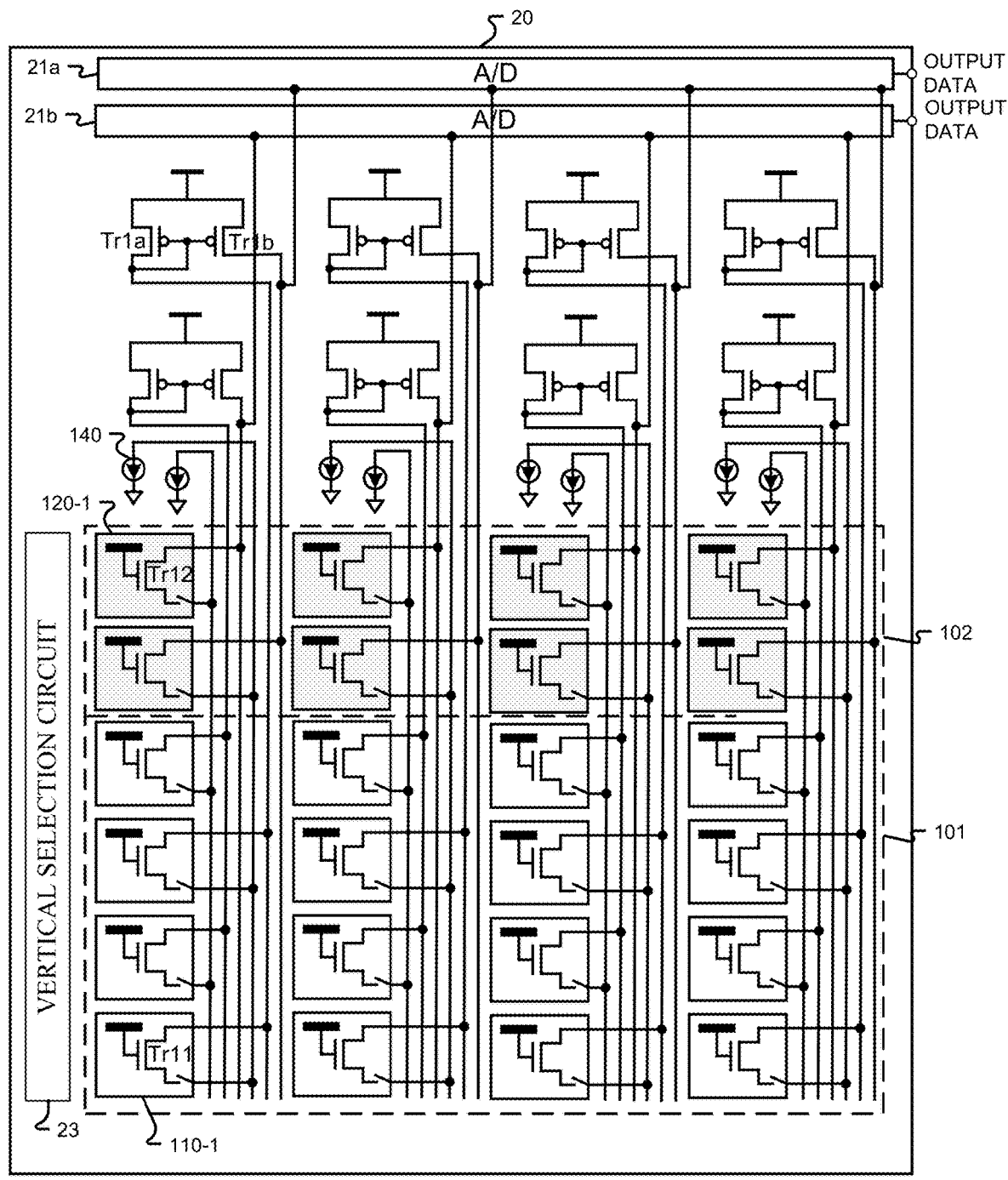
FIG. 14 is an explanatory diagram illustrating a configuration example of the potential measurement apparatus according to the same embodiment.

In the example in FIG. 13, two A/D conversion circuits 21a and 21b are provided at positions opposed to each other in the potential measurement apparatus 20, but the present disclosure is not limited to this example. FIG. 14 is an explanatory diagram illustrating a configuration example of the potential measurement apparatus 20 according to the embodiment of the present disclosure. FIG. 14 illustrates a configuration example of the potential measurement apparatus 20 having two A/D conversion circuits 21a and 21b above the cell array region in the potential measurement apparatus 20.

Each of the cells located in the readout cell region 101 and the reference cell region 102 is coupled to a designated differential amplifier, and outputs from the differential amplifiers are inputted to the respective A/D conversion circuits 21a and 21b. The potential measurement apparatus 20 according to the embodiment of the present disclosure has such a configuration, which makes it possible to input the output signals of the differential amplifiers to the respective two A/D conversion circuits 21a and 21b in the drawing. This makes it possible for the potential measurement apparatus 20 according to the embodiment of the present disclosure to output data from the A/D conversion circuits 21a and 21b, thereby making it possible to output a result of potential measurement to outside of the apparatus at high speed.

Figure 15:
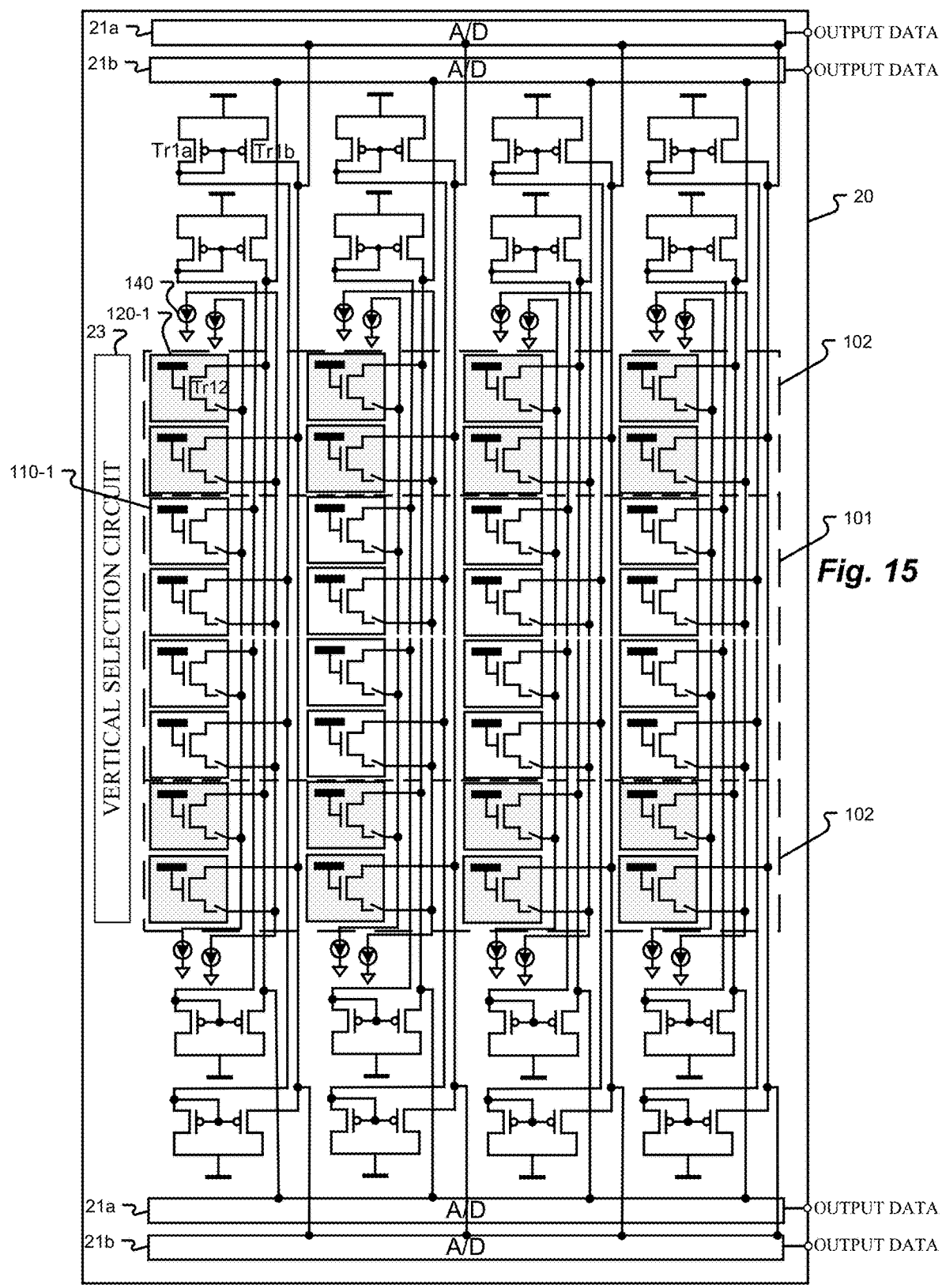
FIG. 15 is an explanatory diagram illustrating a configuration example of the potential measurement apparatus according to the same embodiment.

The potential measurement apparatus 20 according to the embodiment of the present disclosure having a combination of the configuration illustrated in FIG. 13 and the configuration illustrated in FIG. 14 makes it possible to further increase the number of A/D conversion circuits. FIG. 15 is an explanatory diagram illustrating a configuration example of the potential measurement apparatus 20 according to the embodiment of the present disclosure. FIG. 15 illustrates a configuration example of the potential measurement apparatus 20 having four A/D conversion circuits 21a, 21b, 21c, and 21d in total, with two circuits at each of positions opposed to each other (above and below the cell array region in FIG. 15) in the potential measurement apparatus 20.

In the example illustrated in FIG. 15, in order to distribute outputs to the A/D conversion circuits 21a and 21b, and the A/D conversion circuits 21c and 21d, signal lines are separated in a middle portion. The potential measurement apparatus 20 according to the embodiment of the present disclosure has such a configuration, which makes it possible to input the output signals of the differential amplifiers to the respective upper and lower A/D conversion circuits 21a, 21b, 21c, and 21d in the drawing. This makes it possible for the potential measurement apparatus 20 according to the embodiment of the present disclosure to output data from the A/D conversion circuits 21a, 21b, 21c, and 21d, thereby making it possible to output a result of potential measurement to outside of the apparatus at higher speed.

As thus far described, the A/D conversion circuit that performs A/D conversion on an output analog signal of the differential amplifier includes, for example, a slope generator, a comparator circuit, a counter circuit, a latch circuit, a horizontal transfer scanning circuit, and a timing control circuit. In the present embodiment, the comparator circuit may have a configuration in which a Miller capacitance is coupled between an amplifier in a first stage and an amplifier in a second stage. Having a configuration in which the comparator circuit has the Miller capacitance makes it possible to narrow ae band of the A/D conversion circuit. Narrowing the band of the A/D conversion circuit makes it possible to reduce a high-frequency noise component (a thermal noise component generated mainly by the differential amplifier) outside the band, and achieve a reduction in noise.

Figure 16:
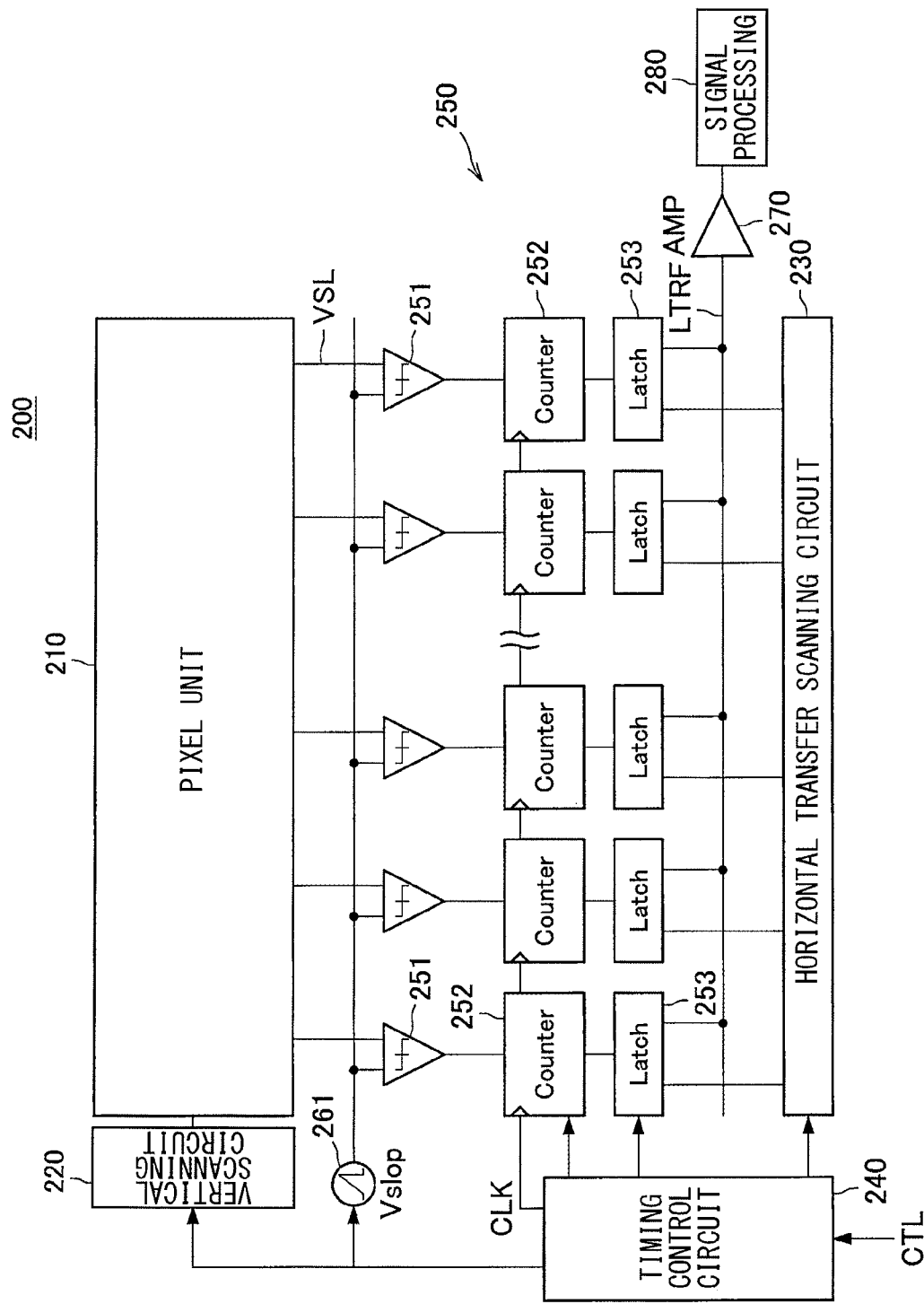
FIG. 16 is an explanatory diagram illustrating a configuration example of the potential measurement apparatus according to the same embodiment.

FIG. 16 is an explanatory diagram illustrating a configuration example of a potential measurement apparatus 200 according to the embodiment of the present disclosure. The potential measurement apparatus 200 illustrated in FIG. 16 includes a cell array unit 210, a vertical scanning circuit 220, a horizontal transfer scanning circuit 230, a timing control circuit 240, and an ADC group 250 as a pixel signal readout unit. In addition, the potential measurement apparatus 200 includes a DAC and a bias circuit including a DAC (digital-to-analog converter) 261, an amplifier circuit (S/A) 270, and a signal processing circuit 280. Among these components, the cell array unit 210, the vertical scanning circuit 220, the horizontal transfer scanning circuit 230, the ADC group 250, the DAC and the bias circuit, and the amplifier circuit (S/A) 270 are configured using an analog circuit. In addition, the timing control circuit 240 and the signal processing circuit 280 are configured using a digital circuit.

The cell array unit 210 may be provided with any of the semiconductor devices 100 described above. The timing control circuit 240 generates an internal clock as a control circuit for sequentially reading signals of the cell array unit 210. The vertical scanning circuit 220 controls row addresses and row scanning of the cell array unit 210. The horizontal transfer scanning circuit 230 controls column addresses and column scanning of the cell array unit 210.

The ADC group 250 includes a plurality of A/D conversion circuits, and each of the A/D conversion circuits has a comparator device (comparator) 251 that compares a reference voltage Vslop having a ramp waveform (RAMP) obtained by changing a reference voltage generated by the DAC 261 in a stepwise manner, with an analog signal (potential VSL) obtained from pixels in each row line via a vertical signal line. Each of the A/D conversion circuits further includes a counter 252 that counts a comparison time and a latch 253 that holds a counting result. The ADC group 250 has an n-bit digital signal conversion function and is disposed for each vertical signal line (column line) to form a column parallel ADC block. An output of each latch 253 is coupled to a 2n bit-wide horizontal transmission line LTRF, for example. Then, 2n amplifier circuits 270 corresponding to the horizontal transfer line LTRF, and the signal processing circuit 280 are disposed.

Figure 17:
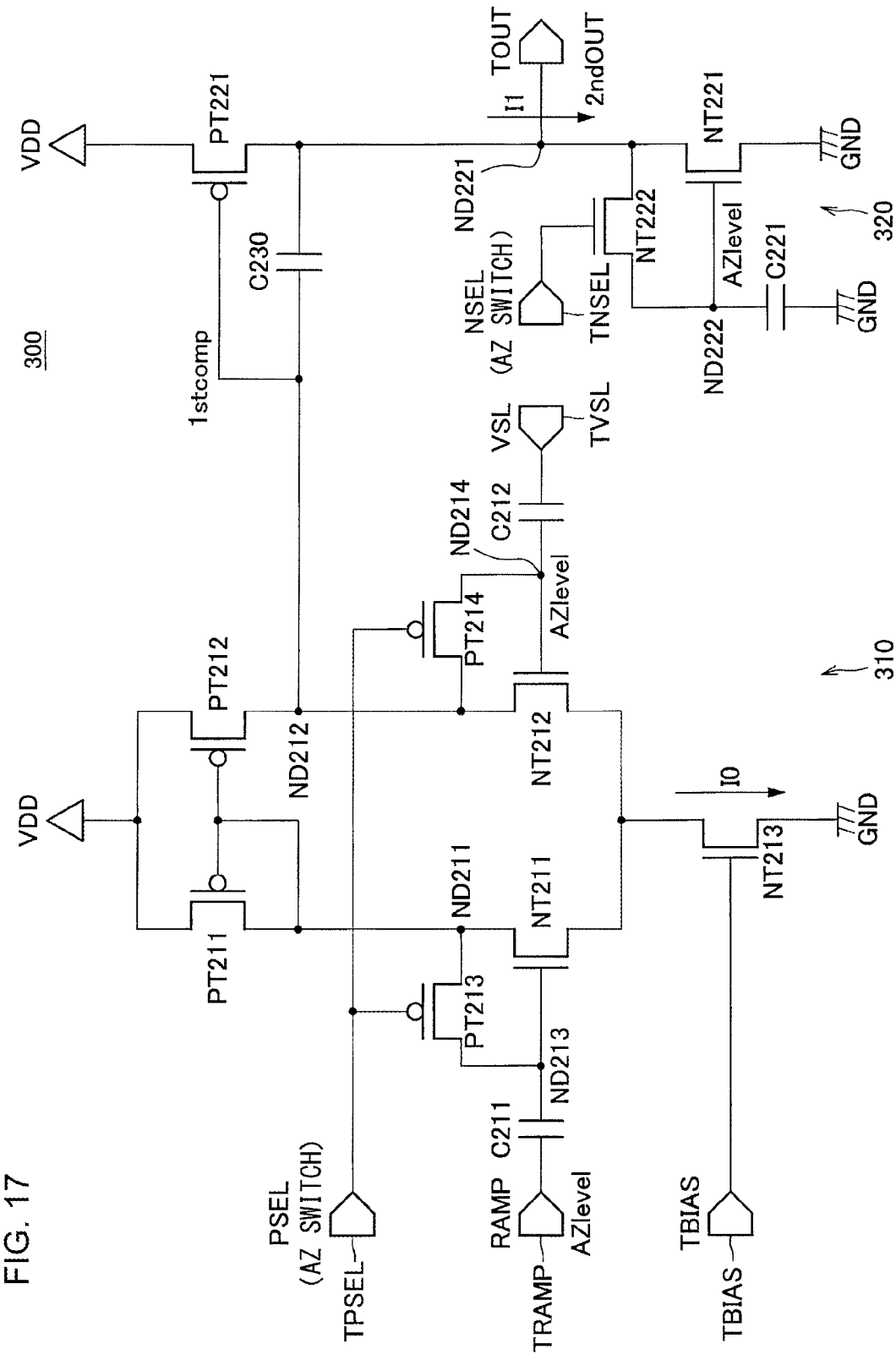
FIG. 17 is an explanatory diagram illustrating a circuit configuration example of a comparator device (comparator) used in the potential measurement apparatus illustrated in FIG. 16.

FIG. 17 is an explanatory diagram illustrating a circuit configuration example of a comparator device (comparator) 300 used in the potential measurement apparatus 200 illustrated in FIG. 16. The comparator device 300 includes a first amplifier 310, a second amplifier 320, and a capacitor C230 for exhibiting the Miller effect that are coupled by cascade connection. The first amplifier 310 includes p-channel MOS (PMOS) transistors PT211 to PT214, n-channel MOS (NMOS) transistors NT211 to NT213, and first and second capacitors C211 and 0212 as sampling capacitors at an AZ level. The second amplifier 320 includes a PMOS transistor PT221, NMOS transistors NT221 and NT222, and a third capacitor C221 as a sampling capacitor at the AZ level.

Detailed description and operation of the comparator device 300 illustrated in FIG. 17 are described, for example, in Japanese Unexamined Patent Application Publication No. 2014-017838. Although not described in detail here, the comparator device 300 illustrated in FIG. 17 include, between the first amplifier 310 and the second amplifier 320, a capacitor C230 for exhibiting the Miller effect, thereby making it possible to exhibit the Miller effect. The capacitor C230 becomes equivalent to coupling a gain-multiplied capacitor to a source-grounded input by exhibition of the Miller effect. The capacitor C230 for exhibiting the Miller effect is included to cause a band of each comparator device 251 to be significantly narrowed with a small capacitor. Each comparator device 251 has a function of initializing (auto-zero: AZ) and sampling (AZ) in order to determine an operation point in each column upon start of a row operation.

Accordingly, the potential measurement apparatus 20 according to the present embodiment includes the comparator device illustrated in FIG. 17, thereby making it possible to narrow a band of the A/D conversion circuit. Narrowing the band of the A/D conversion circuit makes it possible to reduce a high-frequency noise component (a thermal noise component generated mainly by the differential amplifier) outside the band and achieve a reduction in noise.

The configuration illustrated in FIG. 12 in which a plurality of vertical signal line are disposed to simultaneously turn the differential amplifiers in a plurality of rows to the operation state may be applied to the semiconductor device 100 having a configuration in which the reference cell region is disposed perpendicular to a side on which the current mirror circuit is disposed and the readout cell region is disposed between the reference cell regions, for example, as illustrated in FIG. 9.

Figure 18:
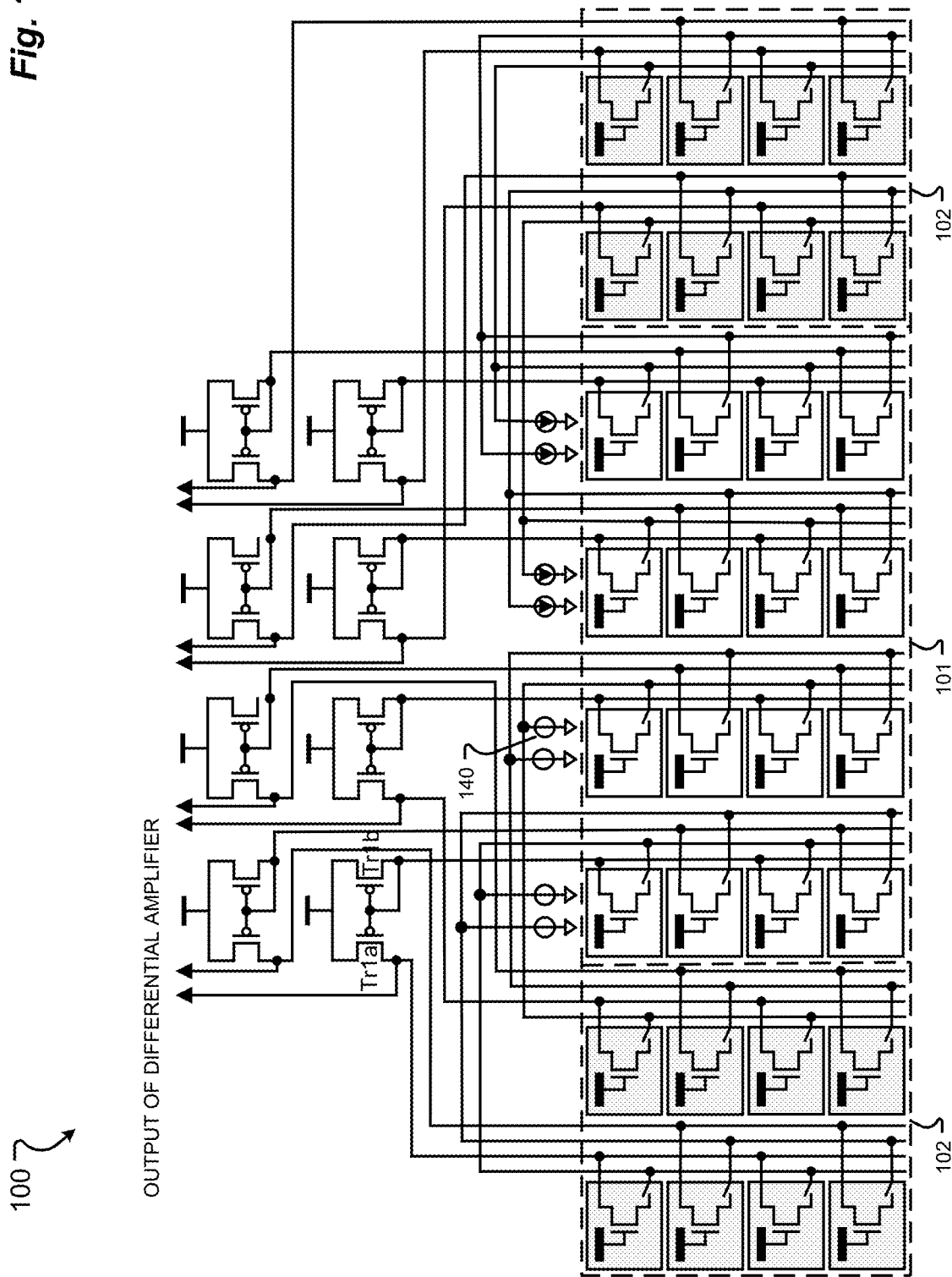
FIG. 18 is an explanatory diagram illustrating a circuit configuration example of the semiconductor device according to the same embodiment.

FIG. 18 is an explanatory diagram illustrating a circuit configuration example of the semiconductor device 100 according to the embodiment of the present disclosure. FIG. 18 illustrates a circuit configuration example of the semiconductor device 100 in which the respective cells in the readout cell region 101 and the reference cell region 102 are coupled to alternate vertical signal lines in a state in which the cell region is separated into the readout cell region 101 and the reference cell region 102. In the example in FIG. 18, two sets of vertical signal lines are disposed for each column, and it is possible to simultaneously perform outputting from the respective cells in the readout cell region 101 and the reference cell region 102 to the differential amplifiers. Needless to say, the number of sets of vertical signal lines disposed for each column is not limited to two.

Figure 19:
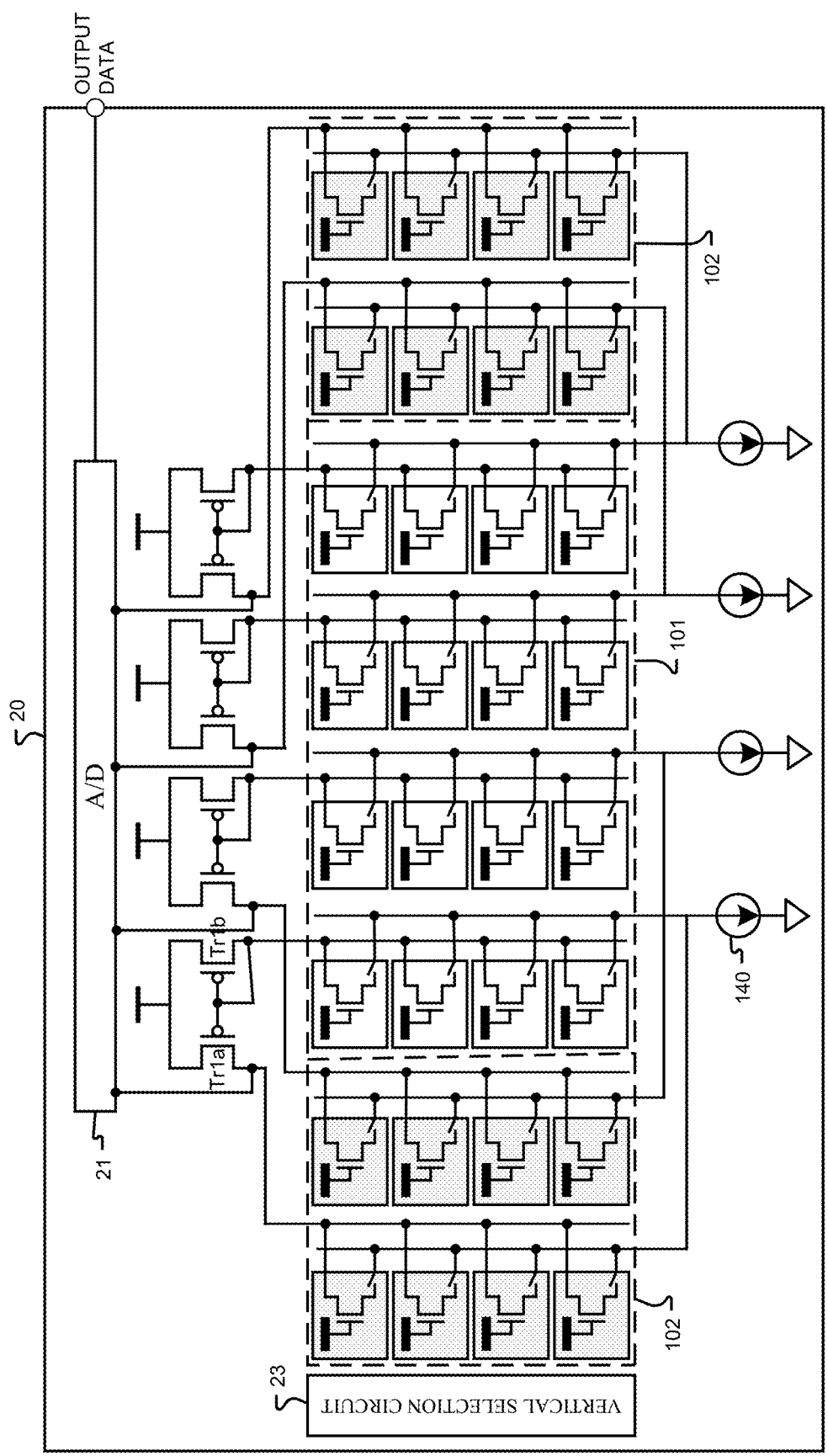
FIG. 19 is an explanatory diagram illustrating a configuration example of the potential measurement apparatus using the semiconductor device illustrated in FIG. 9.

FIG. 19 is an explanatory diagram illustrating a configuration example of the potential measurement apparatus 20 using the semiconductor device 100 illustrated in FIG. 9. The potential measurement apparatus 20 illustrated in FIG. 19 is an apparatus that outputs digital data corresponding to a potential detected by the semiconductor device 100 by converting, by the A/D conversion circuit 21, a signal outputted by the semiconductor device 100 and outputting the converted signal to outside.

Figure 20:
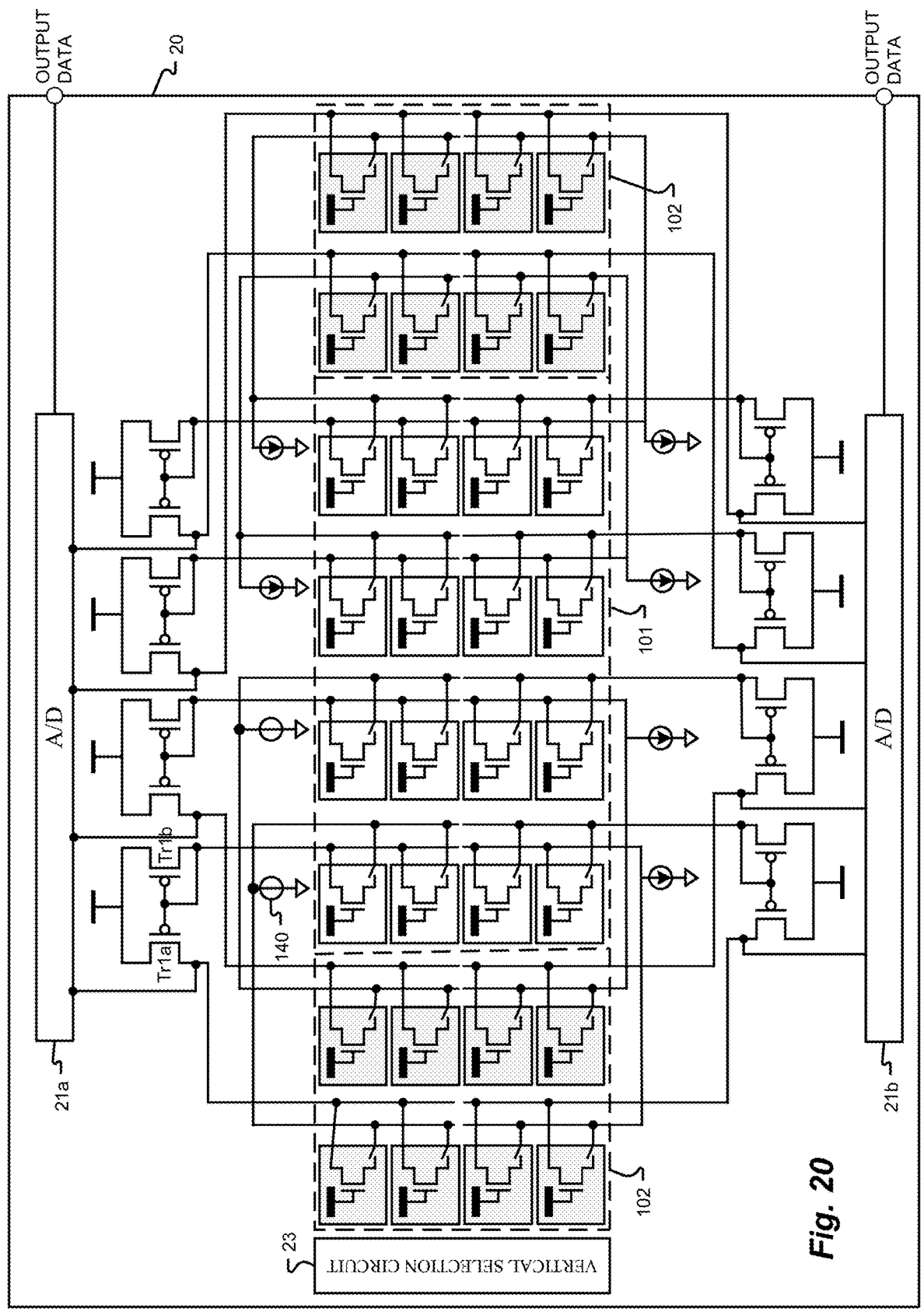
FIG. 20 is an explanatory diagram illustrating a configuration example of the potential measurement apparatus according to the same embodiment.

FIG. 20 is an explanatory diagram illustrating a configuration example of the potential measurement apparatus 20 according to the embodiment of the present disclosure. FIG. 20 illustrates a configuration example of the potential measurement apparatus 20 having two A/D conversion circuits 21a and 21b at positions opposed to each other (above and below the cell array region in the drawing) in the potential measurement apparatus 20. The potential measurement apparatus 20 according to the embodiment of the present disclosure may adopt a configuration in which the reference cell regions 102 are provided on the left and the right in the drawing, and two A/D conversion circuits 21a and 21b are included above and below the cell array region in the drawing.

Then, in the potential measurement apparatus 20 illustrated in FIG. 20, in order to distribute outputs to the two A/D conversion circuits 21a and 21b, signal lines are separated in a middle portion. The potential measurement apparatus 20 according to the embodiment of the present disclosure has such a configuration, which makes it possible to input the output signals of the differential amplifiers to the respective upper and lower A/D conversion circuits 21a and 21b in the drawing. This makes it possible for the potential measurement apparatus 20 according to the embodiment of the present disclosure illustrated in FIG. 20 to output data from the A/D conversion circuits 21a and 21b, thereby making it possible to output a result of potential measurement to outside of the apparatus at high speed.

Figure 21:
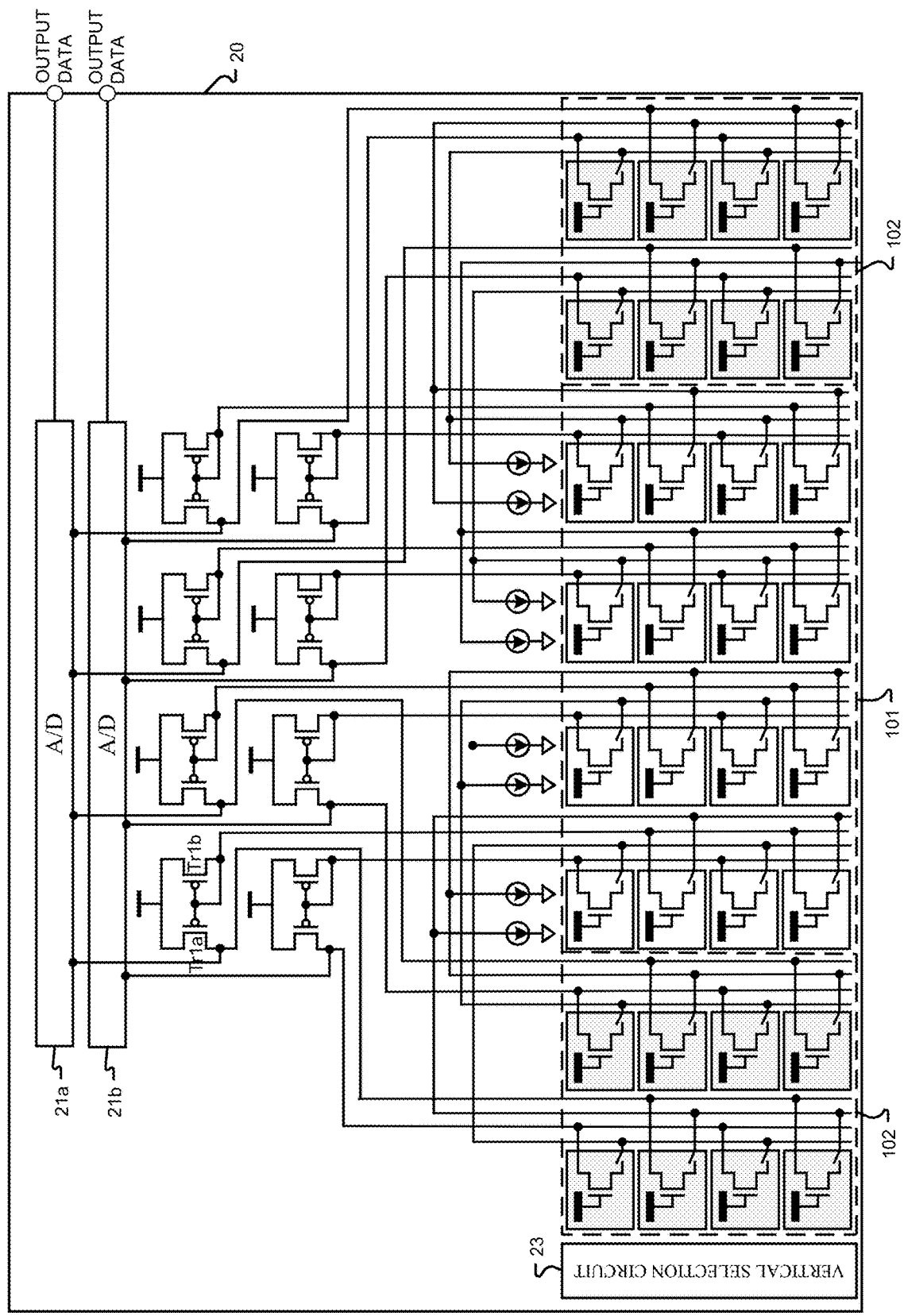
FIG. 21 is an explanatory diagram illustrating a configuration example of the potential measurement apparatus according to the same embodiment.

FIG. 21 is an explanatory diagram illustrating a configuration example of the potential measurement apparatus 20 according to the embodiment of the present disclosure. FIG. 21 illustrates a configuration example of the potential measurement apparatus 20 having two A/D conversion circuits 21a and 21b above the cell array region in the potential measurement apparatus 20.

Each of the cells located in the readout cell region 101 and the reference cell region 102 is coupled to a designated differential amplifier, and outputs from the differential amplifiers are inputted to the respective A/D conversion circuits 21a and 21b. The potential measurement apparatus 20 according to the embodiment of the present disclosure has such a configuration, which makes it possible to input the output signals of the differential amplifiers to the respective two A/D conversion circuit 21a and 21b in the drawing. This makes it possible for the potential measurement apparatus 20 according to the embodiment of the present disclosure to output data from the A/D conversion circuits 21a and 21b, thereby making it possible to output a result of potential measurement to outside of the apparatus at high speed.

Figure 22:
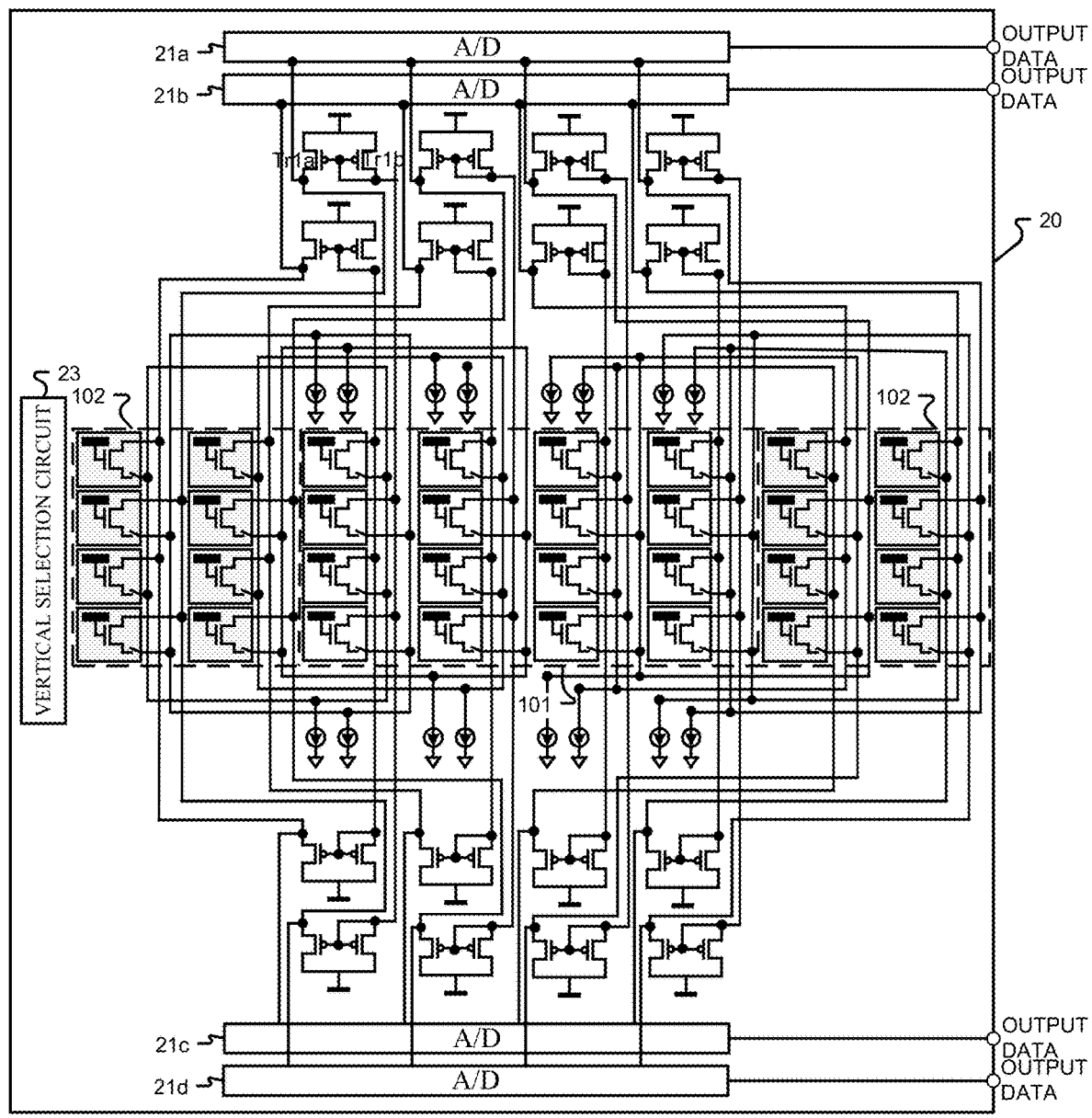
FIG. 22 is an explanatory diagram illustrating a configuration example of the potential measurement apparatus according to the same embodiment.

The potential measurement apparatus 20 according to the embodiment of the present disclosure having a combination of the configuration illustrated in FIG. 20 and the configuration illustrated in FIG. 21 makes it possible to further increase the number of A/D conversion circuits. FIG. 22 is an explanatory diagram illustrating a configuration example of the potential measurement apparatus 20 according to the embodiment of the present disclosure. FIG. 22 illustrates a configuration example of the potential measurement apparatus 20 having four A/D conversion circuits 21a, 21b, 21c, and 21d in total, with two circuits at each of positions opposed to each other (above and below the cell array region in the drawing) in the potential measurement apparatus 20.

In the example illustrated in FIG. 22, in order to distribute outputs to the A/D conversion circuits 21a and 21b and the A/D conversion circuits 21c and 21d, signal lines are separated in a middle portion. The potential measurement apparatus 20 according to the embodiment of the present disclosure has such a configuration, which makes it possible to input the output signals of the differential amplifiers to the respective upper and lower A/D conversion circuits 21a, 21b, 21c, and 21d in the drawing. This makes it possible for the potential measurement apparatus 20 according to the embodiment of the present disclosure to output data from the A/D conversion circuits 21a, 21b, 21c, and 21d, thereby making it possible to output a result of potential measurement to outside of the apparatus at higher speed.

In each of the above-described configurations, A/D conversion is performed on an analog signal outputted by the differential amplifier by oversampling (at a sampling frequency faster than a signal band) to obtain digital data, thereby making it possible to reduce a noise component distributed in the signal band. FIG. 23 is an explanatory diagram illustrating an example of oversampling. As illustrated in FIG. 23, in a case where A/D conversion is performed at a sampling frequency fs, a noise component distributed over an entire frequency, such as thermal noise, becomes aliasing noise, and is distributed from 0 to fs/2. In contrast, in a case where oversampling is performed and sampling is performed at a frequency equal to M times of the sampling frequency, a noise component is distributed from 0 to Mfs/2. Thus, oversampling makes it possible to reduce noise distributed in the signal band.

This oversampling may be adopted in any of the configurations of the potential measurement apparatus 20 and the semiconductor device 100 described above. In particular, in a configuration in which reading speed is increased by simultaneous reading of a plurality of rows and a plurality of A/D conversion circuits, oversampling is performed on a necessary signal band to distribute noise over a wide range of a sampled frequency band and reduce noise distributed in the signal band. Then, filtering processing is performed to extract a signal in the signal band, which makes it possible for the semiconductor device 100 according to the embodiment of the present disclosure to achieve a reduction in noise.

Further, the above-described means makes it possible to achieve an increase in reading speed, which makes it possible to perform multiplexing of AD conversion in a case of an AD converter of a type in which the reference signal and the output signal voltage of the differential amplifier are compared with each other and a count clock is counted on the basis of a result of such comparison. As an example of the AD converter of the type in which the count clock is counted on the basis of the result of comparison is disclosed, for example, in Japanese Unexamined Patent Application Publication No. 2005-328135. Multiplexing of AD conversion is disclosed, for example, in Japanese Unexamined Patent Application Publication No. 2009-296423.

Multiplexing of AD conversion is to repeat n-bit (where n is an integer of 1 or greater) AD conversion processing on each of a P phase and a D phase W times (where W is an integer of 2 or greater) and then perform digital integration processing by summing up results. It is considered that multiplexing of the AD conversion causes signal data to become W times greater, but causes noise to become $\sqrt{W}$ times greater. Accordingly, it is possible for the semiconductor device 100 to alleviate issues of random noise such as quantizing noise and circuit noise associated with AD conversion, which do not exist in processing in an analog domain, and to achieve a further reduction in noise.

Figure 24:
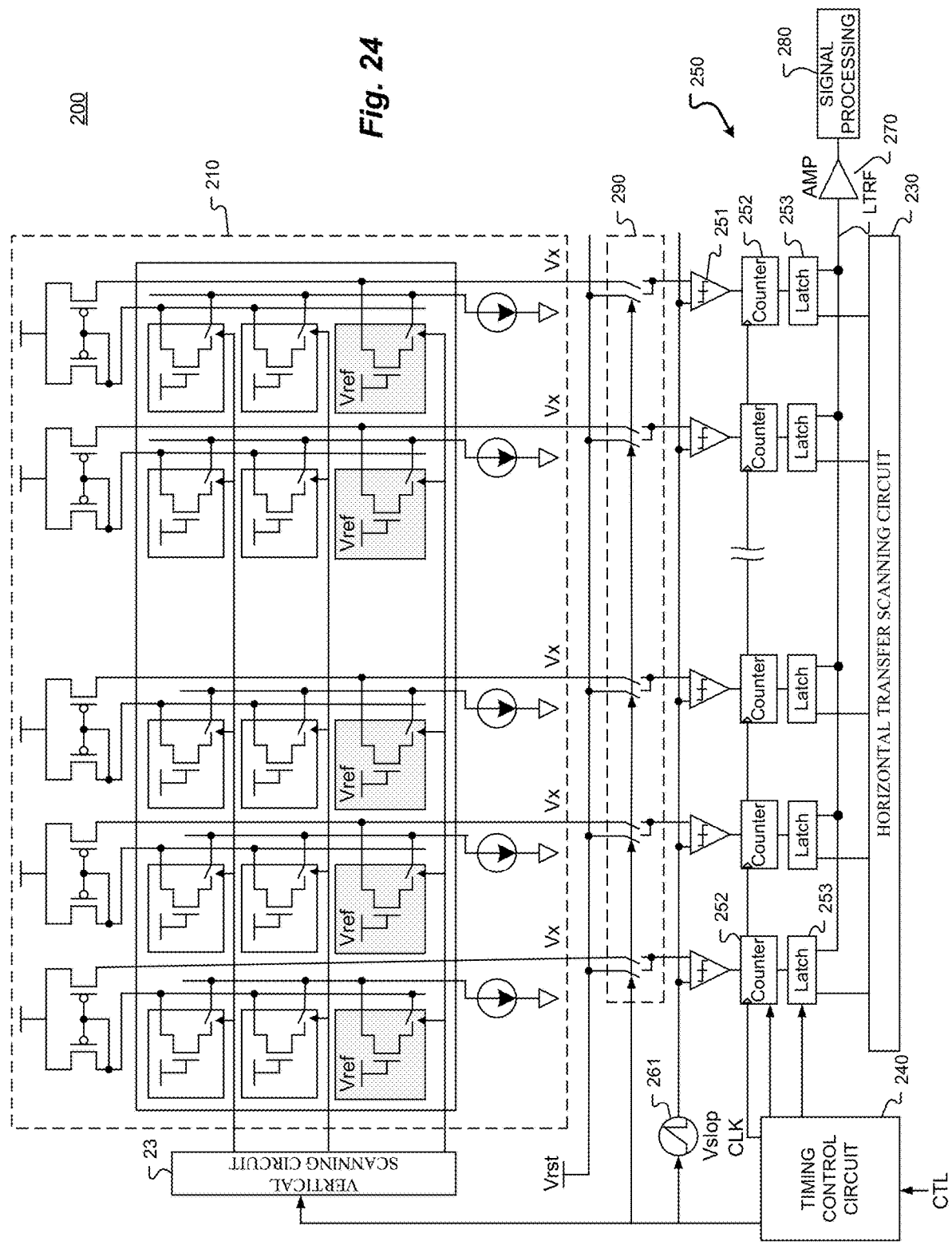
FIG. 24 is an explanatory diagram illustrating a configuration example of the potential measurement apparatus according to the same embodiment.

FIG. 24 is an explanatory diagram illustrating a configuration example of the potential measurement apparatus 200 according to the embodiment of the present disclosure, and illustrates a configuration in which a switching unit 290 is added to the potential measurement apparatus 200 illustrated in FIG. 16. The potential measurement apparatus 200 illustrated in FIG. 24 has a configuration in which an output of the differential amplifier is inputted to a slope type A/D converter, digitally converted, and outputted. However, the potential measurement apparatus 200 according to the present embodiment differs from a configuration disclosed in Japanese Unexamined Patent Application Publication No. 2005-328135 in that, in the configuration disclosed in Japanese Unexamined Patent Application Publication No. 2005-328135, a reset level is outputted from a pixel of an image sensor to be a reference level, whereas in the potential measurement apparatus 200 according to the present embodiment, the differential amplifier continuously outputs a signal of an electrode; therefore, it is necessary to input a reset level from outside of the differential amplifier. Accordingly, in the configuration illustrated in FIG. 24, a reset level Vrst is set as a reset level, and an output signal Vx of the differential amplifier circuit and the reset level signal Vrst are alternately inputted to the AD conversion circuit by switching of a switch by the switching unit 290, thereby obtaining respective levels of the P phase and the D phase to perform AD conversion.

Figure 25:
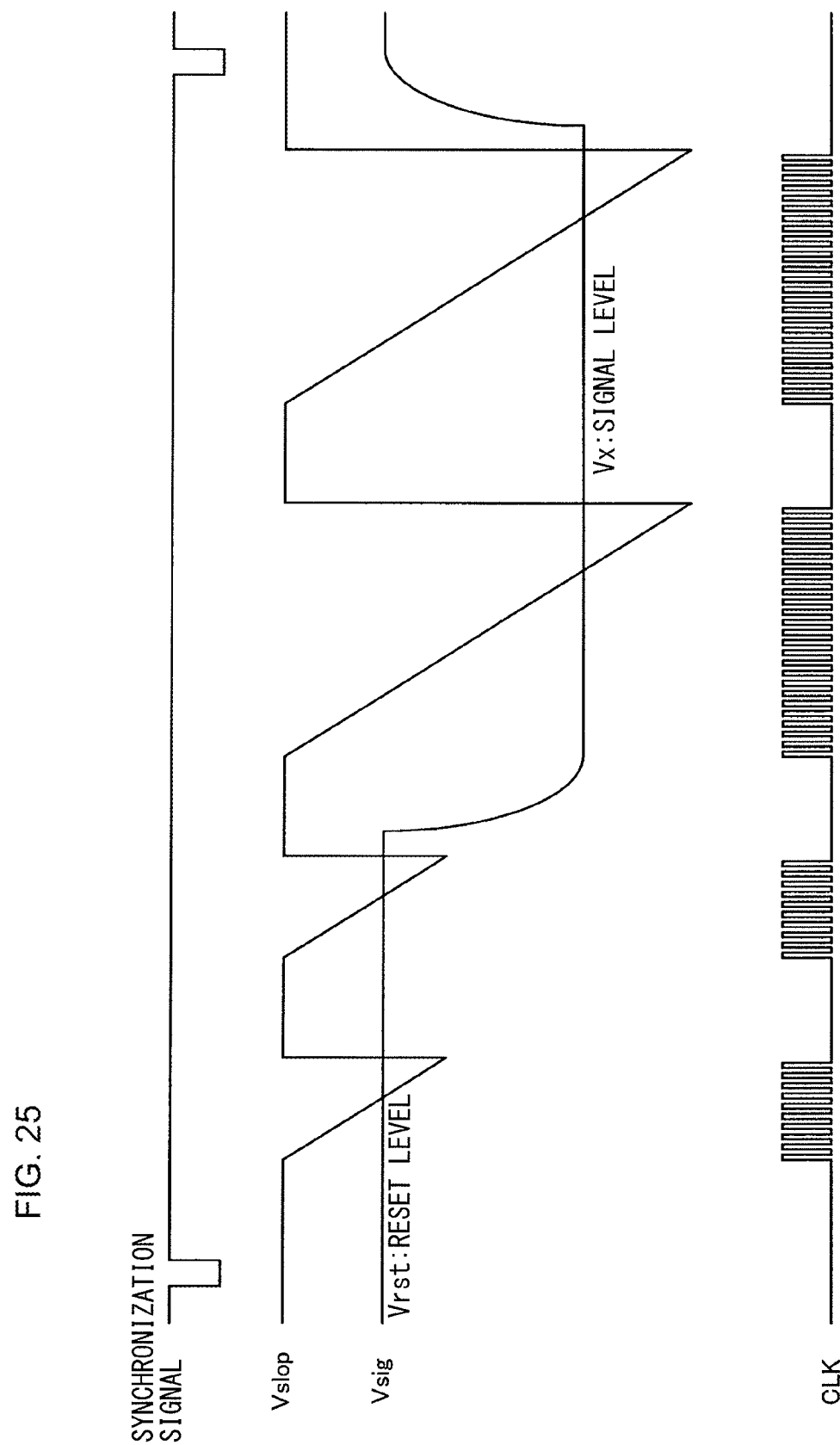
FIG. 25 is an explanatory diagram illustrating a method of operating a multiplexed ADC that is to be executed by the potential measurement apparatus illustrated in FIG. 24.

FIG. 25 is an explanatory diagram illustrating a method of operating a multiplexed ADC that is to be executed by the potential measurement apparatus 200 illustrated in FIG. 24. The potential measurement apparatus 200 consecutively performs reference signal comparison type AD conversion processing on the same signal a plurality of times (W times, where W is a positive integer of 2 or greater) at the time of AD conversion processing on each of the P phase and the D phase. In the second and subsequent processing, the potential measurement apparatus 200 changes a reference signal Vslop for AD conversion in the same manner as in the first processing, and performs counting processing in the same counting mode starting from a previous AD conversion result as a start point.

Doing so makes it possible to obtain data (summation data) equal to W times a result of AD conversion on the same signal in the processing on each of the P phase and the D phase. A calculation result "−W·Drst+W·(Dsig+Drst)=W·Dsig" is obtained by a combination of reversed counting modes in the P phase and the D phase. In addition, it is understood that a counter section serves as a digital integrator. Although the signal becomes W times greater, noise is considered to become √W times greater; therefore, noise characteristics are improved.

There are many processes necessary only for an electrode unit and many processes necessary only for a peripheral circuit unit (for example, an AD conversion unit) in wafer manufacturing processes. For this reason, the electrode unit and the peripheral circuit unit are manufactured in different wafers, the wafers are cut into pieces having an optimum size to obtain semiconductor elements, and the semiconductor elements are bonded together, which makes it possible to achieve manufacturing at lower cost. In addition, applying an optimal generation process to respective wafers makes it possible to expect an improvement in performance of the semiconductor device 100.

For example, in an image sensor, as a solid-state imaging apparatus to which a technology in which a pixel unit and a peripheral circuit unit are divided into different elements and stacked in a CoC (Chip on Chip) manner is applied, there has been proposed a structure in which a peripheral circuit semiconductor element as a peripheral circuit unit is flip-chip mounted in an region outside a pixel on a light receiving surface of a sensor semiconductor element included in a front-illuminated sensor (for example, WO 2010/073520 and the like).

As described above, an analog domain element such as a differential amplifier circuit and a digital domain element such as an AD conversion circuit and a control circuit are mounted on different chips, and a fine process is applied to the digital domain element, which makes it possible to achieve increases in speed and density of the AD conversion circuit. This makes it possible for the semiconductor device 100 to increase sampling speed. In addition, combining structures into which a readout cell array and a reference cell array are separated makes it possible for the semiconductor device 100 to achieve an increase in speed while maintaining low noise and high resolution, and to reduce a chip area.

Figure 26:
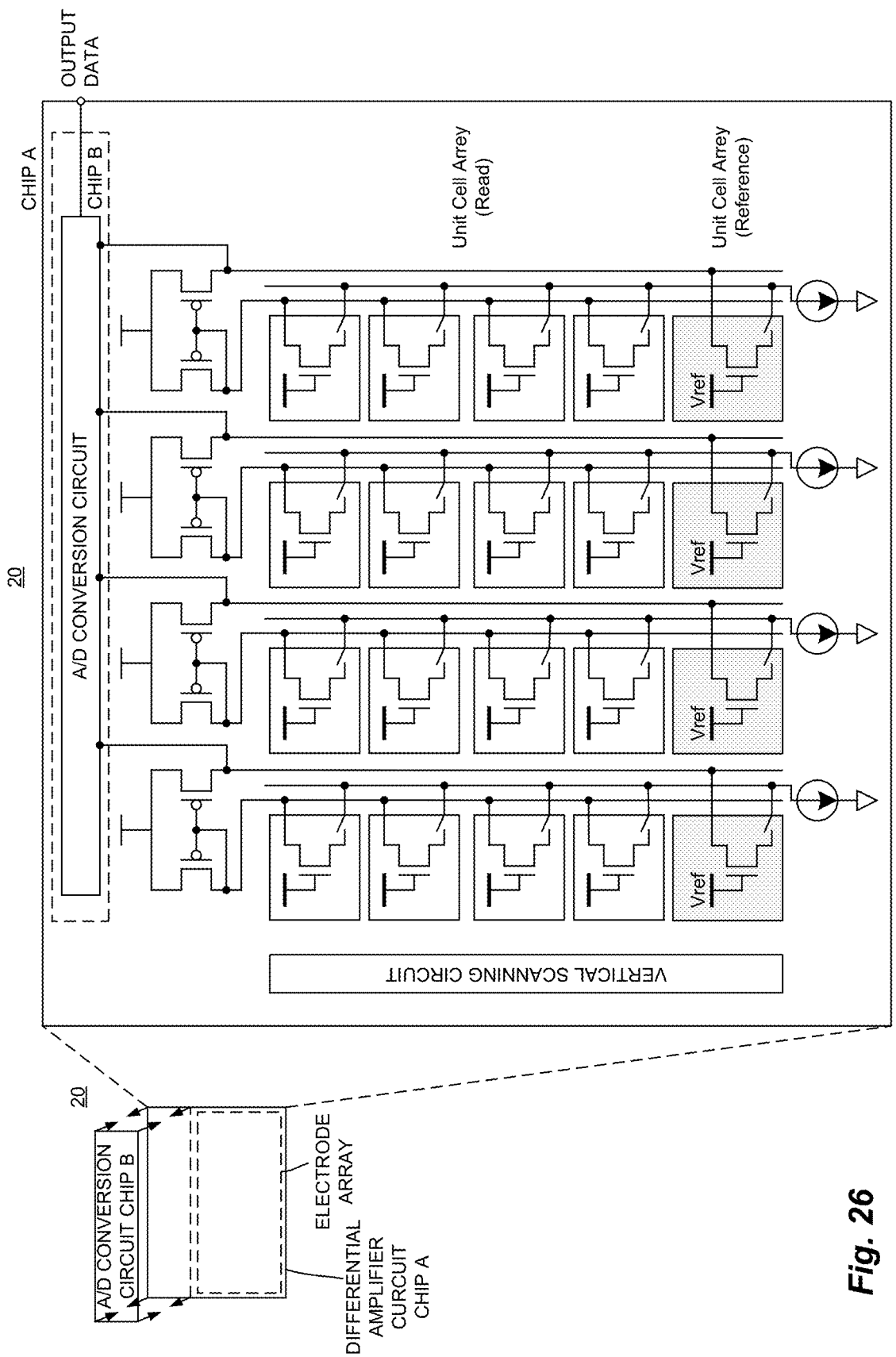
FIG. 26 is an explanatory view illustrating an example of a configuration in which chips are stacked.

FIG. 26 is an explanatory diagram illustrating an example of a structure in which two chips are stacked. In the example illustrated in FIG. 26, a differential amplifier, a horizontal selection circuit, and the like are mounted on a chip A, and an A/D conversion circuit is mounted on a chip B. The A/D conversion circuit operates in a digital domain; therefore, a fine process is applicable to the chip B. This makes it possible for the semiconductor device 100 to achieve a high-speed operation of the A/D conversion circuit and an increase in the density of the A/D conversion circuit.

Figure 27:
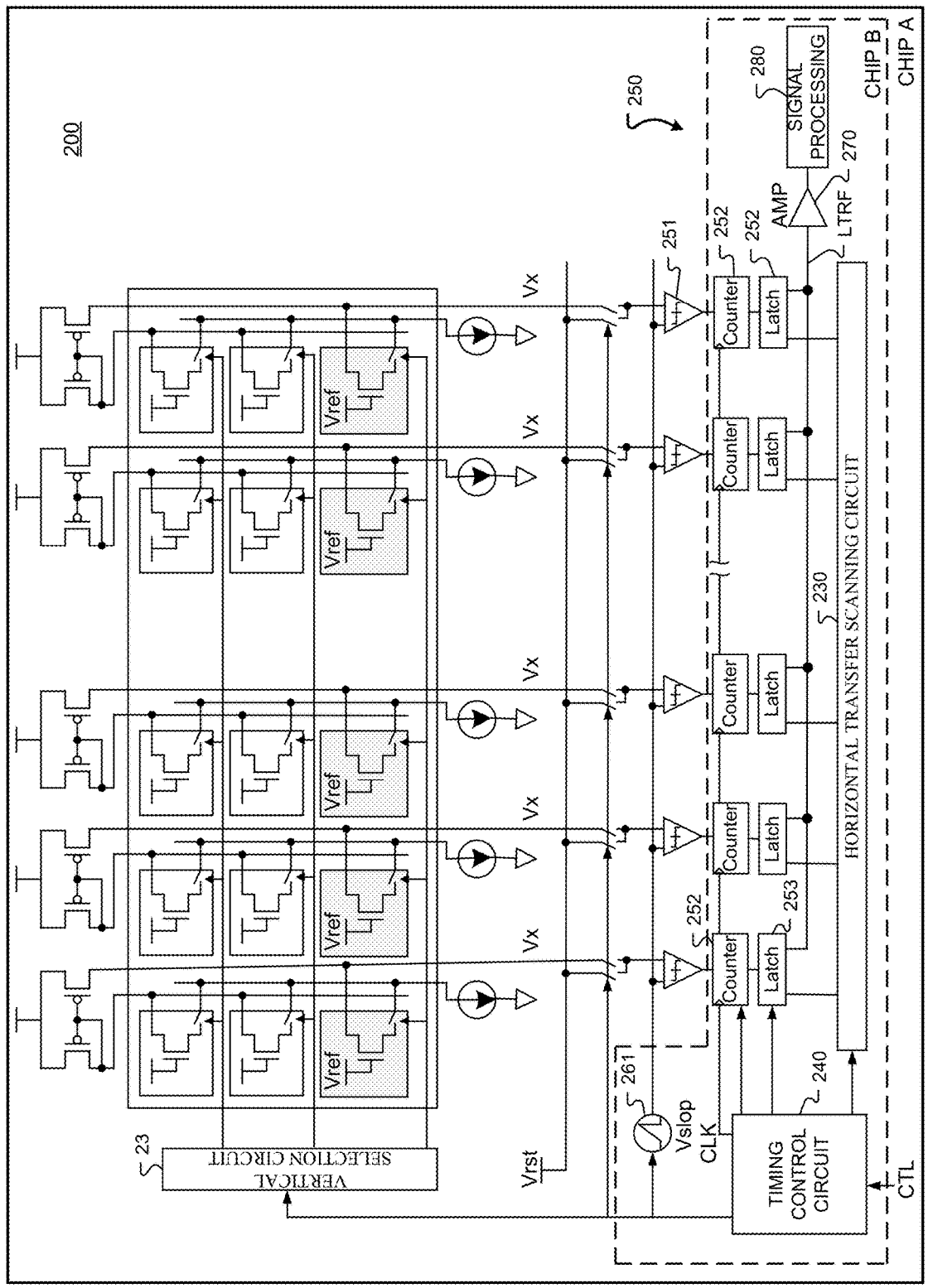
FIG. 27 is an explanatory diagram illustrating an example of a configuration which chips are stacked.

FIG. 27 is an explanatory diagram illustrating an example of a structure in which two chips are stacked, and is an explanatory diagram illustrating an example in a case where a chip stacking structure is applied to a circuit structure to which a slope type AD conversion circuit in FIG. 24 is applied. With respect to a signal flow, a comparator device and previous components that operate in an analog domain are mounted on the chip A, and a counter and subsequent components that operate in a digital domain are mounted on the chip B. In the semiconductor device 100, such chip stacking structure makes it possible to cause a boundary between the analog domain and the digital domain of the A/D converter to be a boundary between chips, and obtain maximum benefit of miniaturization and an increase in speed by fabrication of a stacked chip.

Figure 28:
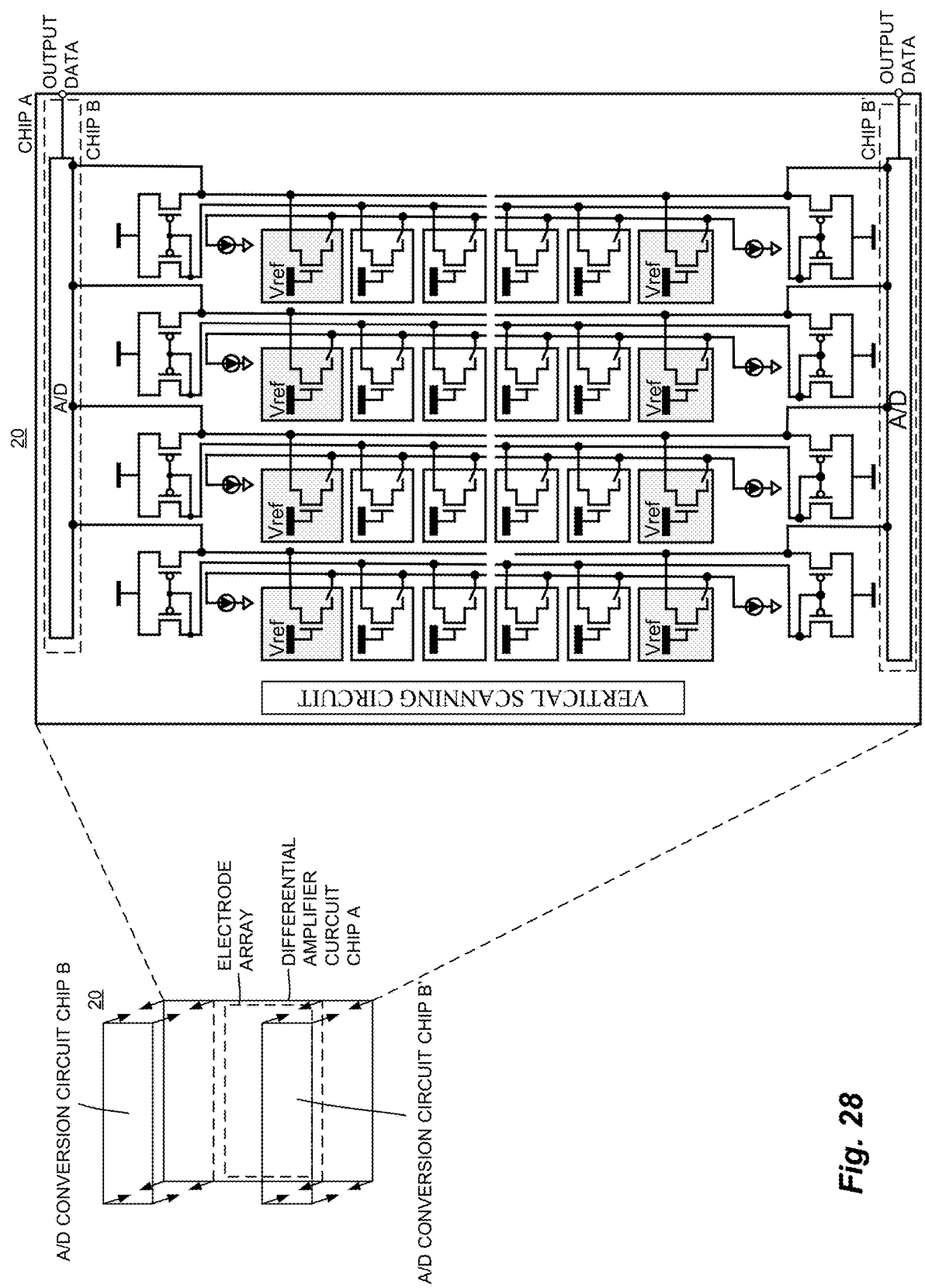
FIG. 28 is an explanatory view illustrating an example of a configuration in which chips are stacked.

FIG. 28 is an explanatory diagram illustrating an example of a structure in which a plurality of chips is stacked on one chip, and is an explanatory diagram illustrating an example in a case where a chip stacking structure is applied to a structure in which the A/D converters illustrated in FIG. 13 are disposed in upper and lower portions. In this manner, a structure in which a plurality of chips is stacked with respect to one chip is also possible. It should be noted that the stacking order of chips, positions of chips to be stacked, the number of chips to be stacked are not limited to those illustrated in FIGS. 26 to 28. In FIGS. 26 to 28, the chip B on which A/D conversion circuit is mounted is superimposed on the chip A, but a stacking structure in which the stacking order is reversed may be adopted.

The effects of the semiconductor device 100 have been described above will be described again.

(FIG. 4)

In the semiconductor device 100 illustrated in FIG. 4, the input transistors are disposed separately in the readout cell and the reference cell; therefore, it is sufficient if one input transistor (amplifier transistor) is disposed in a unit cell, and upsizing the input transistors makes it possible to reduce noise. This makes it possible for the semiconductor device 100 illustrated in FIG. 4 to reduce the cell size and achieve an increase in resolution of the readout cell. The amplifier transistor has a large noise contribution to the differential amplifier circuit; therefore, the amplifier transistor is dominant over an area of the differential amplifier circuit. Accordingly, in the semiconductor device 100 illustrated in FIG. 4, separating the input transistors into the readout cell and the reference cell as described above makes it possible to reduce the area of the cell to about ½ and improve resolution by about twice.

(FIG. 5)

In the semiconductor device 100 illustrated in FIG. 5, sharing the reference cell by a plurality of readout cells makes it possible to reduce the area of the reference cell as compared with the semiconductor device 100 illustrated in FIG. 4 and achieve a cost reduction by expansion of a readout region and a reduction in a chip area.

(FIG. 7)

The semiconductor device 100 illustrated in FIG. 7 makes it possible to further provide an effect of a one-sided auto-zero differential amplifier to the semiconductor device 100 in FIGS. 4 and 5. That is, the differential amplifier in the semiconductor device 100 illustrated in FIG.

7 has a closed loop configuration, which makes it possible to change a potential of the readout electrode without S/N degradation of an input signal while solving an issue of a signal input range of an open loop type differential amplifier. In addition, in the differential amplifier in the semiconductor device 100 illustrated in FIG. 7, capacitively coupling of the reference electrode makes it possible to cancel a common-mode noise component mixed in the readout electrode and the reference electrode and achieve a reduction in noise. In addition, in the differential amplifier in the semiconductor device 100 illustrated in FIG. 7, short-circuiting an output of the differential amplifier and an input of the input transistor on the reference electrode side makes it possible to balance a pair of left and right currents. This makes it possible to sample and hold a state in which a differential input is zero as an input voltage of the reference electrode and cancel a Vth mismatch between the input transistor of the reference cell and the input transistor of the readout cell.

Further, in the semiconductor device 100 illustrated in FIG. 7, separating the input transistors into the readout cell region and the reference cell region makes it possible to achieve low noise and an increase in resolution in addition to these effects. In particular, in the reference cell of the auto-zero differential amplifier, an increase in an area by an additional element is unavoidable; therefore, separating the readout cell and the reference cell in such a manner makes it possible to prevent degradation in resolution of the read electrode by an increase in the area resulting from addition of the element on the reference cell side.

(FIG. 9)

In the semiconductor device 100 illustrated in FIG. 9, in a case where the input transistors are disposed separately in the readout cell and the reference cell, the readout cell region is interposed between two reference cell regions. Such disposition makes it possible for the semiconductor device 100 illustrated in FIG. 9 to cause distances from each of the readout cell and the reference cell to the MOS current mirror circuit and the current source to be uniform, and makes it possible to reduce a difference between voltage drop amounts by wiring. That is, the semiconductor device 100 illustrated in FIG. 9 makes it possible to improve symmetry of a differential pair of the differential amplifier circuit. As a result, the semiconductor device 100 illustrated in FIG. 9 makes it possible to prevent a decrease in a circuit operation range by voltage drops.

(FIG. 10)

In the semiconductor device 100 illustrated in FIG. 10, sharing the reference cell by a plurality of readout cells makes it possible to reduce the area of the reference cell as compared with the semiconductor device 100 illustrated in FIG. 9, and makes it possible to achieve a cost reduction by expansion of the readout region and a reduction in a chip area.

(FIG. 11)

The semiconductor device 100 illustrated in FIG. 11 makes it possible to further provide the effect of the one-sided auto-zero differential amplifier to the semiconductor device 100 illustrated in FIG. 9.

(FIG. 12)

In the semiconductor device 100 illustrated in FIG. 12, differential amplifiers in a plurality of rows are simultaneously turned to the operation state by disposing a plurality of vertical signal lines, which makes it possible to provide an effect of allowing for an increase in reading speed from the cell array.

(FIGS. 13 to 15)

The semiconductor device 100 illustrated in FIGS. 13 to 15 includes a plurality of A/D conversion circuits, and distributes outputs from the cell array region to the respective A/D conversion circuits, which makes it possible to provide the effect of allowing for an increase in reading speed from the cell array (FIGS. 16 to 17)

In the configurations illustrated in FIGS. 16 to 17, a Miller capacitance is coupled between an amplifier in a first stage and an amplifier in a second stage in the comparator circuit, which makes it possible to narrow the band of the A/D conversion circuit. Narrowing the band of the A/D conversion circuit makes it possible to reduce a high-frequency noise component (a thermal noise component generated mainly by the differential amplifier) outside the band, and achieve a reduction in noise.

(FIG. 18)

In the semiconductor device 100 illustrated in FIG. 12, differential amplifiers in a plurality of rows are simultaneously turned to the operation state by disposing a plurality of vertical signal lines, which makes it possible to provide the effect of allowing for an increase in reading speed from the cell array.

(FIGS. 20 to 22)

The semiconductor device 100 illustrated in FIGS. 20 to 22 includes a plurality of A/D conversion circuits, and distributes outputs from the cell array region to the respective A/D conversion circuits, which makes it possible to provide the effect of allowing for an increase in reading speed from the cell array.

(FIG. 23)

In addition, in each of the configurations, oversampling is executed during A/D conversion, thereby making it possible to reduce a noise component distributed in the signal band. In particular, in a configuration in which reading speed is increased by simultaneous reading of a plurality of rows and a plurality of A/D conversion circuits, oversampling is performed on a necessary signal band to distribute noise over a wide range of a sampled frequency band and reduce noise distributed in the signal band. Then, filtering processing is performed to extract a signal in the signal band, which makes it possible for the semiconductor device 100 according to the embodiment of the present disclosure to achieve a reduction in noise.

(FIGS. 24 and 25)

In a case where a slope type ADC is applied and multiplexing of AD conversion is performed, signal data becomes W times greater, but noise becomes $\sqrt{W}$ times greater. Performing multiplexing of AD conversion as illustrated in FIG. 24 makes it possible to alleviate issues of random noise such as quantizing noise and circuit noise associated with AD conversion, which do not exist in processing in an analog domain, and to achieve a further reduction in noise.

(FIGS. 26 to 28)

Further, as illustrated in FIGS. 26 to 28, in a case where a manufacturing process for stacking a plurality of chips is applied to the semiconductor device 100, it is possible to achieve increases in speed and density of the A/D conversion circuit. This makes it possible to increase sampling speed of the semiconductor device 100. In addition, combining structures into which a readout cell array and a reference cell array are separated makes it possible for the semiconductor device 100 to achieve an increase in speed while maintaining low noise and high resolution, and to reduce a chip area.

2. Summary

As described above, according to the embodiment of the present disclosure, it is possible to provide, in a semiconductor device that is able to simultaneously detect potentials at multiple points, the semiconductor device 100 that achieves a reduction in the cell circuit area and an increase in resolution, and the potential measurement apparatus 20 using the semiconductor device 100.

A preferred embodiment(s) of the present disclosure has/ have been described above in detail with reference to the accompanying drawings, but the technical scope of the present disclosure is not limited to such an embodiment(s). It is apparent that a person having ordinary skill in the art of the present disclosure may arrive at various alterations and modifications within the scope of the technical idea described in the appended claims, and it is understood that such alterations and modifications naturally fall within the technical scope of the present disclosure.

In addition, the effects described herein are merely illustrative and exemplary, and not limitative. That is, the technology according to the present disclosure may exert other effects that are apparent to those skilled in the art from the description herein, in addition to the above-described effects or in place of the above-described effects.

It should be noted that the following configurations also fall within the technical scope of the present disclosure.

(1)

A semiconductor device including:

a first region in which readout cells are arranged in an array form, the readout cells having one of input transistors included in a differential amplifier: and a second region in which reference cells are arranged in an array form, the reference cells having another input transistor included in the differential amplifier, the first region and the second region being separated from each other.

(2)

The semiconductor device according to (1), in which the first region is a region in which a potential of a signal is measured, and the second region is a region in which a reference potential is set.

(3)

The semiconductor device according to (1) or (2), in which the differential amplifier includes a current mirror circuit and a current source.

(4)

The semiconductor device according to (3), in which distances from each of the first region and the second region to the current mirror circuit and the current source are substantially equal.

(5)

The semiconductor device according to (3) or (4), in which a plurality of the readout cells correspond to one of the reference cells disposed in the second region to configure the differential amplifier.

(6)

The semiconductor device according to any one of (3) to (5), in which, in the differential amplifier, an electrode is coupled to the input transistor coupled to the current mirror that is diode-coupled, and an output is coupled to the other input transistor through a capacitor.

(7)

The semiconductor device according to (6), wherein a switch that resets an operation point is included between an input unit of the other input transistor and the differential amplifier.

(8)

The semiconductor device according to (7), in which a reference potential is set, and a reference electrode is included, the reference electrode being coupled to the input unit of the other input transistor through a capacitor.

(9)

The semiconductor device according to (1) or (2), in which the differential amplifier includes a plurality of the readout cells corresponding to one of the reference cells disposed in the second region.

(10)

The semiconductor device according to any one of (1) to (9), in which a plurality of output signal lines from the differential amplifier are provided in parallel, and a plurality of the differential amplifiers are simultaneously turned to an operation state to simultaneously read outputs from the plurality of the differential amplifiers.

(11)

A potential measurement apparatus including:

the semiconductor device according to any one of (1) to (10);

a horizontal selection circuit that selects a readout cell and a reference cell of semiconductor device; and an A/D conversion circuit that converts an analog signal outputted from the semiconductor device into a digital signal.

(12)

The potential measurement apparatus according to (11), in which the second region is provided on a side opposed to a region in which the A/D conversion circuit is provided with the first region interposed therebetween.

(13)

The potential measurement apparatus according to (11), in which the A/D conversion circuit is provided at each of positions between which the semiconductor device is interposed.

(14)

The potential measurement apparatus according to (13), wherein a plurality of the A/D conversion circuits is provided at each of the positions between which the semiconductor device is interposed.

(15)

The potential measurement apparatus according to (13) or (14), in which the first region of the semiconductor device is provided at a position interposed between the second regions, and the A/D conversion circuit is provided at each of positions between which the second regions are interposed.

(16)

The potential measurement apparatus according to (13), in which the first region of the semiconductor device is provided at a position interposed between the second regions, and the A/D conversion circuits are provided at positions perpendicular to the second regions.

(17)

The potential measurement apparatus according to (13), wherein a plurality of the A/D conversion circuits is provided on one side of the semiconductor device.

(18)

The potential measurement apparatus according to any one of (11) to (17), in which the A/D conversion circuit includes a comparator circuit that compares a predetermined reference potential with an output from the semiconductor device, and the comparator circuit includes an amplifier in a first stage, an amplifier in a second stage, and a Miller capacitance coupled between the amplifier in the first stage and the amplifier in the second stage.

(19)

The potential measurement apparatus according to any one of (11) to (18), in which the A/D conversion circuit converts an analog signal outputted from the semiconductor device into a digital signal by oversampling.

(20)

The potential measurement apparatus according to any one of (11) to (19), in which the A/D conversion circuit is driven to execute digital integration processing in which n-bit AD conversion (where n is an integer of 1 or greater) is repeated W times (where W is an integer of 2 or greater).

(21)

The potential measurement apparatus according to any one of (11) to (20), including:

a first chip in which a portion or an entirety of the A/D conversion circuit is formed; and a second chip on which the first chip is stacked and in which a configuration other than a configuration formed in the first chip is formed.

(22)

The potential measurement apparatus according to (21), in which a plurality of the first chip is stacked on the second chip.

REFERENCE SIGNS LIST

20: potential measurement apparatus
100: semiconductor device
101: readout cell region
102: reference cell region
110: readout cell
120: reference cell
130: differential amplifier
140: current source

What is claimed is:

1. A semiconductor device, comprising:
a first region in which readout cells are arranged in an array form, the readout cells having one input transistor included in a differential amplifier; and
a second region in which reference cells are arranged in an array form, the reference cells having another input transistor included in the differential amplifier,
wherein the second region includes two portions, a first portion provided on a first side of the first region and a second portion provided on a second side of the first region,
wherein the first portion of the second region and the second portion of the second region are provided on opposite sides of the first region,
wherein a plurality of output signal lines from the differential amplifier are provided in parallel, and a plurality of the differential amplifiers are simultaneously turned to an operation state to simultaneously read outputs from the plurality of the differential amplifiers.

2. The semiconductor device according to claim 1, wherein the first region is a region in which a potential of a signal is measured, and
wherein the second region is a region in which a reference potential is set.

3. The semiconductor device according to claim 1, wherein the differential amplifier includes a current mirror circuit and a current source provided either above or below the first and second regions in a vertical direction.

4. The semiconductor device according to claim 3, wherein distances in the vertical direction between the current mirror circuit and the current source for each of the first region, the first portion of the second region and the second portion of the second region are substantially equal.

5. The semiconductor device according to claim 3, wherein a plurality of the readout cells correspond to one of the reference cells disposed in the second region to configure the differential amplifier.

6. The semiconductor device according to claim 3, wherein, in the differential amplifier, an electrode is coupled to the one input transistor coupled to the current mirror that is diode-coupled, and an output is coupled to the another input transistor through a capacitor.

7. The semiconductor device according to claim 1, wherein a plurality of the readout cells correspond to one of the reference cells disposed in the second region to configure the differential amplifier.

8. A potential measurement apparatus, comprising:
a semiconductor device, comprising:
a first region in which readout cells are arranged in an array form, the readout cells having one input transistor included in a differential amplifier; and
a second region in which reference cells are arranged in an array form, the reference cells having another input transistor included in the differential amplifier;
a horizontal selection circuit that selects a readout cell and a reference cell of semiconductor device; and
an A/D conversion circuit that converts an analog signal outputted from the semiconductor device into a digital signal,
wherein the A/D conversion circuit includes a comparator circuit that compares a predetermined reference potential with an output from the semiconductor device, and
wherein the comparator circuit includes an amplifier in a first stage, an amplifier in a second stage, and a Miller capacitance coupled between the amplifier in the first stage and the amplifier in the second stage.

9. The potential measurement apparatus according to claim 8, wherein the second region is provided on a side opposed to a side in which the A/D conversion circuit is provided with the first region interposed therebetween.

10. The potential measurement apparatus according to claim 8, wherein a plurality of the A/D conversion circuits are provided, and wherein one A/D conversion circuit is provided at each position between which the semiconductor device is interposed.

11. The potential measurement apparatus according to claim 10, wherein multiple A/D conversion circuits of the plurality of the A/D conversion circuits are provided at each of the positions between which the semiconductor device is interposed.

12. The potential measurement apparatus according to claim 10, wherein a plurality second regions are provided, wherein the first region of the semiconductor device is provided at a position interposed between the plurality of second regions, and wherein one A/D conversion circuit is provided at each position between which the plurality of second regions are interposed.

13. The potential measurement apparatus according to claim 10, wherein a plurality second regions are provided, wherein the first region of the semiconductor device is provided at a position interposed between the plurality of second regions, and wherein the A/D conversion circuit is provided at positions perpendicular to the plurality of second regions.

14. The potential measurement apparatus according to claim 8, wherein a plurality of the A/D conversion circuits are provided on one side of the semiconductor device.

15. The potential measurement apparatus according to claim 8, wherein the A/D conversion circuit converts an analog signal outputted from the semiconductor device into a digital signal by oversampling.

16. The potential measurement apparatus according to claim 8, wherein the A/D conversion circuit is driven to execute digital integration processing in which n-bit AD conversion (where n is an integer of 1 or greater) is repeated W times (where W is an integer of 2 or greater).

17. The potential measurement apparatus according to claim 8, further comprising:
    a first chip in which a portion or an entirety of the A/D conversion circuit is formed; and
    a second chip on which the first chip is stacked and in which a configuration other than a configuration formed in the first chip is formed.

18. The potential measurement apparatus according to claim 17, wherein a plurality of the first chips are stacked on the second chip.

* * * * *